(12) United States Patent
Hayes et al.

(10) Patent No.: US 8,158,016 B2
(45) Date of Patent: Apr. 17, 2012

(54) METHODS OF OPERATING AN ELECTROMAGNET OF AN ION SOURCE

(75) Inventors: Alan V. Hayes, Great Neck, NY (US); Rustam Yevtukhov, Briarwood, NY (US); Viktor Kanarov, Bellmore, NY (US); Boris L. Druz, Brooklyn, NY (US)

(73) Assignee: Veeco Instruments, Inc., Woodbury, NY (US)

( * ) Notice: Subject to any disclaimer, the term of this patent is extended or adjusted under 35 U.S.C. 154(b) by 1087 days.

(21) Appl. No.: 12/037,598

(22) Filed: Feb. 26, 2008

(65) Prior Publication Data

US 2008/0179284 A1    Jul. 31, 2008

Related U.S. Application Data

(63) Continuation-in-part of application No. 11/678,979, filed on Feb. 26, 2007, now Pat. No. 7,557,362, which is a continuation-in-part of application No. 10/772,132, filed on Feb. 4, 2004, now Pat. No. 7,183,716.

(60) Provisional application No. 60/891,669, filed on Feb. 26, 2007.

(51) Int. Cl.
*G01L 21/30* (2006.01)
*B44C 1/22* (2006.01)
(52) U.S. Cl. ............... 216/59; 216/66; 216/67
(58) Field of Classification Search .......... None
See application file for complete search history.

(56) References Cited

U.S. PATENT DOCUMENTS

| 1,624,071 A | 4/1927 | Kneeland |
| 2,103,623 A | 12/1937 | Hermann |
| 2,257,411 A | 9/1941 | Bernhard |
| 2,305,758 A | 12/1942 | Berghaus et al. |
| 2,346,483 A | 4/1944 | Goss |
| 2,463,180 A | 3/1949 | Johnson |
| 2,843,542 A | 7/1958 | Callahan |

(Continued)

FOREIGN PATENT DOCUMENTS

DE    4325041 B4    2/1994

(Continued)

OTHER PUBLICATIONS

European Patent Office, Partial International Search Report issued in corresponding PCT Application serial No. PCT/US2008/055016 dated Jul. 31, 2008.

(Continued)

*Primary Examiner* — Allan Olsen
(74) *Attorney, Agent, or Firm* — Wood, Herron & Evans, LLP

(57) ABSTRACT

Methods of operating an electromagnet of an ion source for generating an ion beam with a controllable ion current density distribution. The methods may include generating plasma in a discharge space of the ion source, generating and shaping a magnetic field in the discharge space by applying a current to an electromagnet that is effective to define a plasma density distribution, extracting an ion beam from the plasma, measuring a distribution profile for the ion beam density, and comparing the actual distribution profile with a desired distribution profile for the ion beam density. Based upon the comparison, the current applied to the electromagnet may be adjusted either manually or automatically to modify the magnetic field in the discharge space and, thereby, alter the plasma density distribution.

26 Claims, 12 Drawing Sheets

U.S. PATENT DOCUMENTS

| | | | |
|---|---|---|---|
| 3,100,272 A | 8/1963 | Wehner | |
| 3,233,137 A | 2/1966 | Anderson | |
| 3,329,601 A | 7/1967 | Mattox | |
| 3,394,066 A | 7/1968 | Miles | |
| 3,458,426 A | 7/1969 | Calderon | |
| 3,619,402 A | 11/1971 | Block et al. | |
| 3,875,028 A | 4/1975 | Atlee et al. | |
| 4,116,793 A | 9/1978 | Penfold | |
| 4,118,973 A | 10/1978 | Tucker et al. | |
| 4,132,612 A | 1/1979 | Penfold | |
| 4,132,613 A | 1/1979 | Penfold | |
| 4,277,939 A * | 7/1981 | Hyman, Jr. | 60/202 |
| 4,342,901 A | 8/1982 | Zajac | |
| 4,578,559 A | 3/1986 | Hijikata et al. | |
| 4,624,767 A | 11/1986 | Obinata | |
| 4,632,719 A | 12/1986 | Chow | |
| 4,641,031 A | 2/1987 | Ito et al. | |
| 4,713,585 A * | 12/1987 | Ohno et al. | 315/111.81 |
| 4,739,169 A * | 4/1988 | Kurosawa et al. | 250/423 R |
| 4,844,775 A | 7/1989 | Keeble | |
| 4,857,809 A * | 8/1989 | Torii et al. | 315/111.31 |
| 4,858,556 A * | 8/1989 | Siebert | 118/664 |
| 4,946,576 A | 8/1990 | Dietrich | |
| 4,963,242 A | 10/1990 | Sato | |
| 5,009,738 A | 4/1991 | Gruenwald et al. | |
| 5,021,919 A | 6/1991 | Engemann | |
| 5,036,252 A | 7/1991 | Lob | |
| 5,086,015 A * | 2/1992 | Itoh et al. | 204/192.34 |
| 5,391,281 A | 2/1995 | Hieronymi et al. | |
| 5,527,394 A | 6/1996 | Heinrich | |
| 5,556,521 A | 9/1996 | Ghanbari | |
| 5,997,686 A | 12/1999 | Lardon et al. | |
| 6,664,547 B2 | 12/2003 | Benveniste | |
| 6,939,434 B2 * | 9/2005 | Collins et al. | 156/345.35 |
| 7,183,716 B2 | 2/2007 | Kanarov et al. | |
| 7,303,982 B2 | 12/2007 | Collins et al. | |
| 7,420,189 B2 * | 9/2008 | Imamura et al. | 250/492.21 |
| 7,550,748 B2 * | 6/2009 | Caliendo et al. | 250/492.21 |
| 2003/0205679 A1 * | 11/2003 | Benveniste | 250/423 R |
| 2004/0163766 A1 | 8/2004 | Kanarov et al. | |
| 2006/0157201 A1 * | 7/2006 | Hoffman et al. | 156/345.46 |
| 2008/0135753 A1 * | 6/2008 | Yamashita et al. | 250/310 |
| 2008/0179284 A1 * | 7/2008 | Hayes et al. | 216/61 |
| 2008/0237491 A1 * | 10/2008 | Caliendo et al. | 250/492.3 |
| 2009/0001282 A1 * | 1/2009 | Hofmeester et al. | 250/424 |

FOREIGN PATENT DOCUMENTS

| | | |
|---|---|---|
| EP | 0045858 A2 | 2/1982 |
| FR | 2779317 A1 | 12/1999 |
| JP | 01302645 | 12/1989 |
| JP | 04147969 A | 5/1992 |
| JP | 61-62856 A | 6/1994 |
| JP | 07-105893 | 4/1995 |
| JP | 3071814 B2 | 7/2000 |
| WO | 9222920 A1 | 12/1992 |

OTHER PUBLICATIONS

U.S. Patent and Trademark Office, Notice of Allowance dated as mailed on Mar. 24, 2009 for related U.S. Appl. No. 11/678,979.

European Patent Office, International Search Report issued in corresponding PCT Application serial No. PCT/US2008/055016 dated Dec. 9, 2008.

Japanese Patent Office, translation of Official Action issued in related Japanese Patent Application Serial No. 2009-551065 dated May 9, 2011.

* cited by examiner

METHODS OF OPERATING AN ELECTROMAGNET OF AN ION SOURCE

CROSS-REFERENCE TO RELATED APPLICATIONS

The present application is a continuation-in-part of U.S. patent application Ser. No. 11/678,979, now U.S. Pat. No. 7,557,362, filed Feb. 26, 2007, which is a continuation-in-part of U.S. patent Ser. No. 10/772,132, now U.S. Pat. No. 7,183, 716, filed Feb. 4, 2004, the disclosure of each of which is hereby incorporated herein by reference in its entirety. The present application claims the benefit of U.S. Provisional Application Ser. No. 60/891,669, filed Feb. 26, 2007, the disclosure of which is hereby incorporated herein by reference in its entirety.

FIELD OF THE INVENTION

The invention relates to methods of operating an electromagnet of an ion source to generate an ion beam with tailored operating characteristics.

BACKGROUND OF THE INVENTION

Ion beam processing systems are used in a variety of applications for modifying the properties of a substrate during the fabrication of thin film devices, such as semiconductor and data storage devices. In particular, etching steps may be used to remove and shape layers of material on a substrate. A conventional etching procedure involves the use of a working gas ionized into a plasma state at low pressures (i.e., at pressures less than about 1 mTorr) from which ions are extracted and accelerated by ion optics for ion beam etching (IBE) of wafer materials.

As device critical dimensions shrink, the need for improved process uniformity without sacrificing beam directionality has driven the search for improved ion sources. IBE uniformity is directly related to the beam current density distribution of ions and energetic neutrals arising from charged ions converted to neutrals in charge exchange ion-atom collisions during the beam transport. The integrated beam particle flux should be independent of the impact position on the substrate. The angular distribution of the charged and neutral beam particles at the substrate is directly related to the angular properties of the trajectories of the ions extracted from the plasma by the optics of the source. To optimize process uniformity, the incident particle trajectories across the substrate should be approximately parallel.

Conventional ion sources commonly utilize a helical or coil antenna that is wrapped about a discharge vessel to generate an inductively coupled plasma (ICP) using high frequency electromagnetic field energy, such as radio-frequency (RF) electromagnetic energy. The antenna of the ion source, when carrying an oscillating high frequency current, induces a time-varying magnetic field inside the discharge vessel. In accordance with Faraday's law, the time-varying magnetic field induces a solenoidal high frequency electric field, which accelerates the electrons in an azimuthal direction in the discharge vessel and sustains the ICP. Because the low pressure ICP is diffusion dominated, the plasma density and, thereby, the radial plasma ion flux distribution at the ion optics plane, of a conventional broad ion beam source is invariably convex, i.e., highest at the center of the source and decreasing radially with increasing distance from the center of the source. This introduces non-uniformities into the ion current density distribution of the broad ion beams generated by such conventional ion sources.

Typical broad beam ion sources utilize a multi-electrode accelerator system for forming and accelerating the ions into a beam. The electrodes in this system are flat or dished multi-aperture plates, typically called grids. A conventional method of compensating for the effect on the ion density profile of the plasma non-uniformities described above is to radially vary the transparency of the grids so as to decrease the beam current density in the center. However, this compensation method has several limitations. Variations in the transparency of the ion optics cannot compensate for variations in the plasma density profile for different ion source operating conditions (i.e., RF power, beam voltage and current, gas type and pressure), for any time dependence of these factors between system maintenance periods, or for variations in source and ion optics. The variations in source and ion optics may be either short and/or long term service condition changes in a given etch module because of the effect of mass and thermal loads, or module-to-module variations due to differences in ion source or grid construction. Furthermore, a concave or convex beam ion density distribution is sometimes desirable for a particular process to compensate for variations in other aspects of processing of the substrates, such as beam spreading during transport to the wafer, clamp effects at the periphery of the substrate, variations in the thickness of the material layer being etched, or variations in the width of the etch mask features.

Additionally, localized variations in the plasma radial and/or azimuthal density distributions typically limit the uniformity of the IBE process. The location and shape of these variations are dependent on the operating conditions. The transparency of the grid optics cannot be easily modified to compensate for this dependence on operating conditions.

An ion source can have a physical construction that helps reduce non-uniformities in the ion beam profile. However, the ion source may require an adjustment to eliminate non-uniformities observed in the ion beam density. The adjustment may be required when an ion source is initially used, after an ion source is used for an extended period of time, if process conditions are changed, or following source maintenance. The ability to make efficient adjustments after these events may increase yields of usable devices created from the ion source operation and may reduce waste.

What is needed, therefore, are methods for modifying and/or optimizing the performance of an ion source to generate an ion beam with tailored operating characteristics.

SUMMARY OF THE INVENTION

Embodiments of the invention are directed generally to methods for modifying the performance of an ion source to generate an ion beam with tailored operating characteristics. Generally, the ion source may include a plasma discharge vessel, a cup-shaped re-entrant vessel projecting into the plasma discharge vessel, at least one electromagnet, and at least one tubular pole piece. The electromagnet and tubular pole piece may be coaxially arranged inside the re-entrant vessel. Each electromagnet is adapted to induce a magnetic field for changing a shape of the plasma inside the plasma discharge vessel.

In one embodiment, a method is provided for modifying the performance of a radiofrequency ion source comprising a discharge space and an electromagnet. The method comprises generating plasma with a particular plasma density distribution from a working gas in the discharge space, applying a current to the electromagnet to generate a magnetic field in the discharge space that is effective to reform the plasma density distribution, and extracting an ion beam from the plasma. The method further comprises determining an actual distribution profile of the ion beam density proximate to a wafer processing location, and comparing the actual distribution profile of the ion beam density with a desired distribution profile for the ion beam density. Based upon the comparison, the current applied to the electromagnet is either manually or automatically adjusted to modify magnetic field and, thereby, change the plasma density distribution.

These and other advantages will be apparent in light of the following figures and detailed description.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
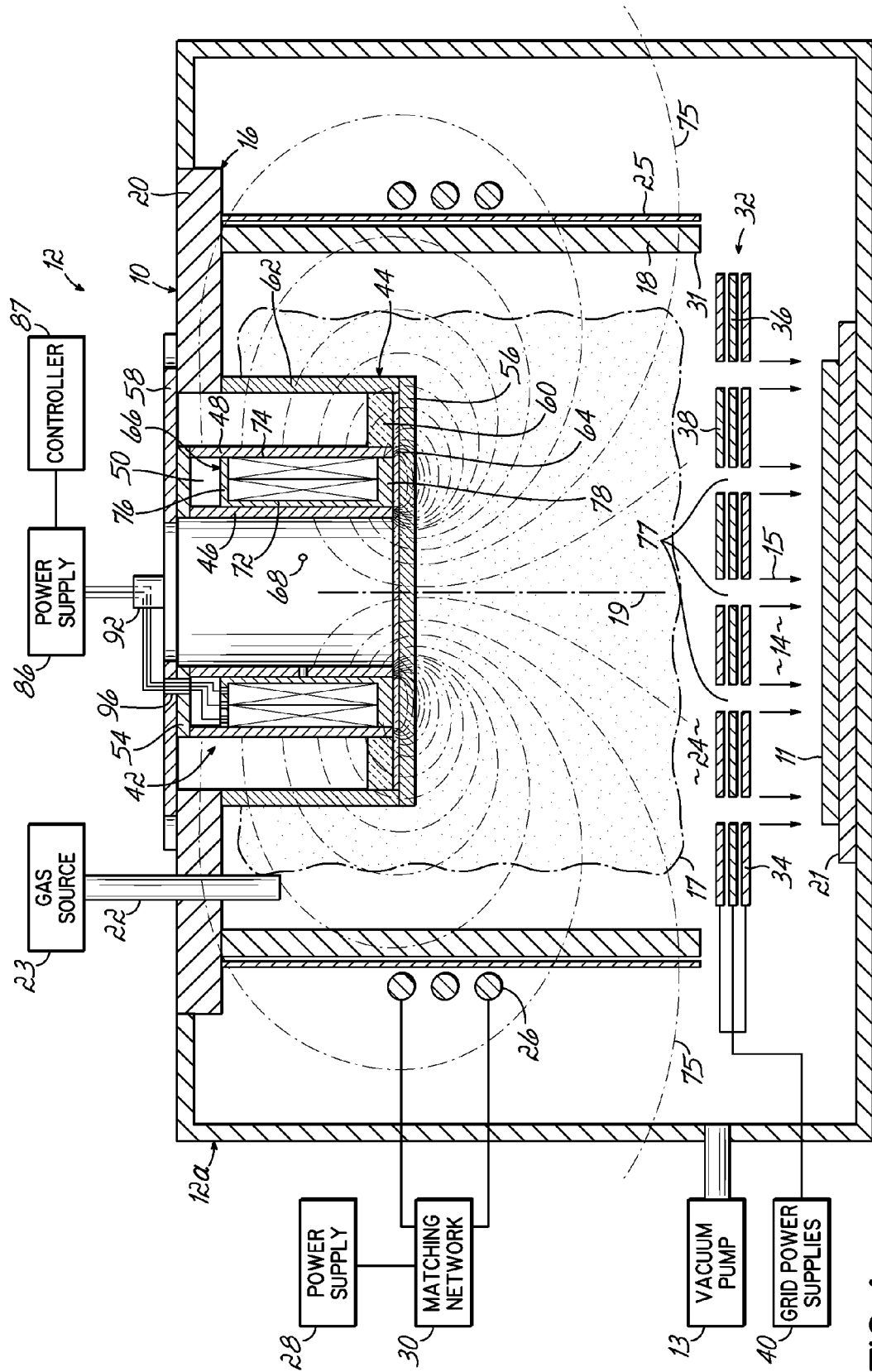
FIG. 1 is a cross-sectional view of a portion of a high vacuum processing system incorporating an ion source with an embodiment of an electromagnet assembly.
Figure 2:
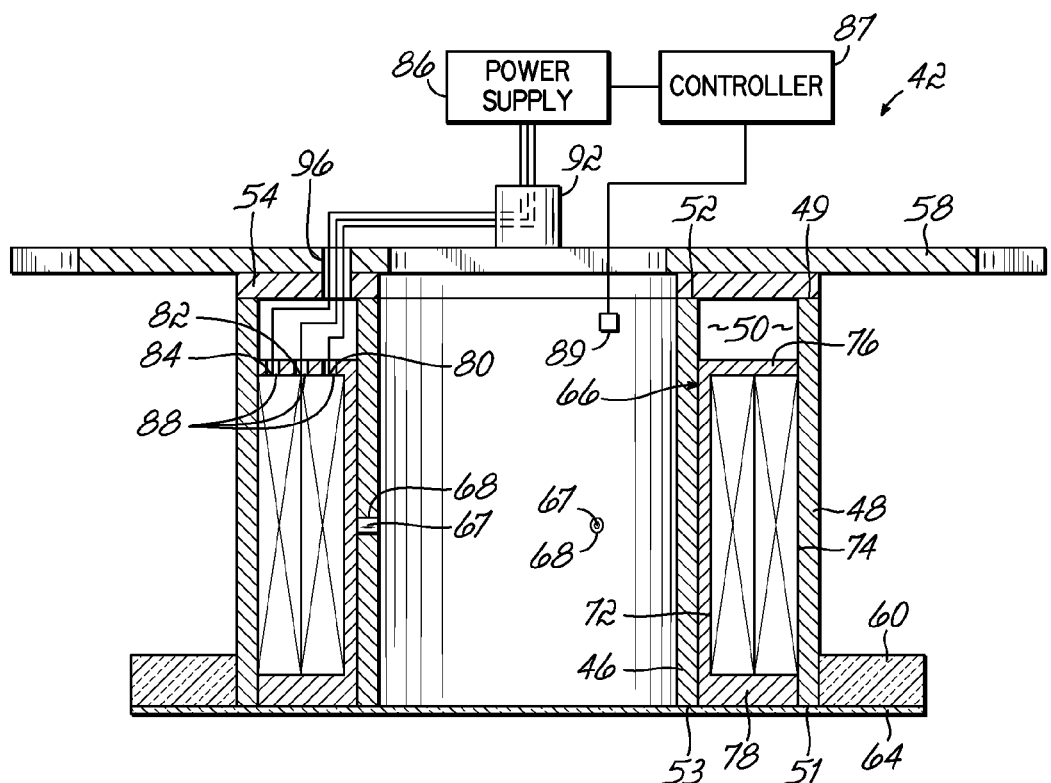
FIG. 2 is an enlarged view of an electromagnet assembly of the ion source and electromagnet assembly of FIG. 1.

With reference to FIGS. 1 and 2, an ion source 10 for use in a vacuum processing system 12 is adapted to generate an ion beam of working gas ions, which is diagrammatically represented by single headed arrows 15, that is directed toward at least one wafer or substrate 11. The vacuum processing system 12 includes a process chamber 12a with a chamber wall that encloses a processing space 14 and a high vacuum pump 13 configured to communicate with the processing space 14 through the chamber wall of the process chamber 12a. The ion beam 15 may comprise working gas ions extracted from plasma 17 generated from an ionizable working gas by the ion source 10 and directed through the process chamber 12a toward the substrate 11. Bombardment of the substrate 11 by the ion beam 15 processes the substrate 11 to achieve an intended beneficial result. Among other beneficial results, the ion beam 15 may be used to remove material from a top surface of the substrate 11 by an ion beam etching process.

The ion source 10 includes a discharge chamber 16 defined by tubular sidewall 18, which is generally centered about an azimuthal axis 19. The tubular sidewall 18 has an opening defined by an open end 31 and a back flange 20 closing the opposite end of the tubular sidewall 18. The tubular sidewall 18 is formed at least partially from a dielectric material, such as quartz or alumina. High frequency electromagnetic energy, in particular radio frequency electromagnetic energy, can penetrate through the dielectric material portion of the tubular sidewall 18 with low losses within the material. The ion source 10 includes various high vacuum sealing members (not shown) that provide hermetic seals for vacuum isolation. A gas inlet 22, which extends through the back flange 20, communicates with a discharge space 24 enclosed inside the discharge chamber 16. The gas inlet 22 permits a regulated flow rate of the working gas to be introduced from a metered gas source 23 to the discharge space 24. A sub-atmospheric environment, which may be at a vacuum pressure typically in the range of 0.05 mTorr to 5 mTorr, is maintained in the discharge space 24 by virtue of fluid communication with the evacuated process chamber 12a.

A coil antenna 26 is wrapped about a portion of the exterior of the discharge chamber 16. A power supply 28 is electrically coupled with the coil antenna 26 through an impedance matching network 30. The power supply 28 may provide power to the coil antenna 26 at a frequency ranging from about 500 kHz to about 15 MHz. An optional Faraday shield 25 is disposed between the coil antenna 26 and the tubular sidewall 18.

High frequency electromagnetic energy, such as radiofrequency (RF) electromagnetic energy, is transmitted from the coil antenna 26 to the working gas in the discharge space 24 for generating and sustaining the plasma 17. More specifically, an electrical current oscillates at a high frequency in the coil antenna 26, which generates a time-dependent magnetic field transmitted to the discharge space 24 through the optional Faraday shield 25 and subsequently through the tubular sidewall 18. The time-dependent magnetic field induces an azimuthal electric field inside the discharge space 24 having field lines concentric with the coil antenna 26. The induced azimuthal electrical field accelerates electrons inside the discharge space 24 to travel along circular trajectories. Collisions between the energetic electrons and neutral atoms of the working gas ionize the gas atoms and generate additional electrons that are accelerated in the azimuthal electrical field. This generates and sustains the plasma 17 in the discharge space 24.

A multi-aperture ion optic or grid assembly 32, which is situated at the open end 31 of the tubular sidewall 18, is used to extract the working gas ions from the plasma 17 generated in the discharge space 24 and to form the working gas ions into the ion beam 15 propagating to the substrate 11 to the process chamber 12a. The grid assembly 32 includes a plurality of grids 34, 36, 38 spanning the tubular sidewall 18 at the open end 31 of the ion source 10. When appropriately biased, the grids 34, 36, 38 substantially contain the plasma 17 within the discharge space 24 and control the extraction of the ion beam 15 from the discharge space 24. Each of the grids 34, 36, 38 is perforated by an array of apertures 77 that allow charged particles to pass through the grid assembly 32. Typically, the apertures 77 of the grids 34, 36, 38 are round and closely aligned with each other.

The substrate 11 is supported inside the processing space 14 of process chamber 12a in a spaced relationship with the grid assembly 32. The substrate 11 may also may be tilted, offset, and/or rotated about or relative to its own azimuthal axis. A sub-atmospheric environment, which may be at a working gas pressure, typically in the range of 0.05 mTorr to 1 mTorr, is maintained in the discharge space 24 by virtue of fluid or pumping communication through the grid assembly 32 and the open end 31 of the tubular sidewall 18 with the evacuated process chamber 12a.

Grid power supplies 40 are electrically coupled with the grids 34, 36, 38. In an embodiment having operational requirements for operation with a positive ion beam, the extraction or "screen" grid 38 may be biased by one of the grid power supplies 40 with an adjustable positive electrical potential to allow formation of a positive ion beam from the discharge to the beam and increase the ion energy. The "accelerator" or "suppressor" grid 36 may be biased by one of the grid power supplies 40 with an adjustable negative electrical potential to increase the effective ion beam extraction voltage and suppress beam plasma electrons penetrating through the grid apertures of "decelerator" grid 34, which is typically at a ground potential.

A cup-shaped re-entrant vessel 44 projects from the back flange 20 into the discharge space 24 toward grid assembly 32. The re-entrant vessel 44, which may be formed from a conductor such as aluminum, includes an end wall 56 and a sidewall 62 extending axially from the end wall 56 to the back flange 20. The sidewall 62 of the re-entrant vessel 44 and the tubular sidewall 18 of the discharge chamber 16 may be concentric and aligned coaxially with the azimuthal axis 19. The substrate 11 is received and held on a substrate support 21 that is disposed within the process chamber 12a such that the top surface of the substrate 11 confronts the open end 31.

With reference to FIGS. 1 and 2, the ion source 10 includes an electromagnet 42 that is at least partially installed in the re-entrant vessel 44 and that includes pole pieces in the representative form of at least tubular pole pieces 46, 48. In this representative embodiment, the pole pieces 46, 48 have the geometrical shape of a right circular cylinder and are concentrically arranged about the azimuthal axis 19. In alternative embodiments, the pole pieces 46, 48 may have any suitable tubular geometrical shape, including but not limited to elliptical cylinders, conical frustums, or pyramidal frustums, each of which has a sidewall extending about a central bore.

In the representative embodiment, the pole piece 46 is disposed radially inside the pole piece 48 such that the outer concave surface of the pole piece 46 confronts the inner convex surface of the pole piece 48. The pole piece 46 includes opposite open ends 52, 53 separated by a height along the azimuthal axis 19 and the pole piece 48 extends between opposite open ends 49, 51 also separated by the height. The pole pieces 46, 48 are separated by an open space or gap 50.

The axial position of the electromagnet 42 with respect to the grid assembly 32 and/or the lateral position with respect to the azimuthal axis 19 may be optimized to tailor the profile of the plasma density distribution and, thereby, the density distribution of the plasma ion flux at the grids 34, 36, 38 by controlling the distribution of the electromagnetic field of the electromagnet 42 within the discharge space 24. In particular, the electromagnet 42 may be laterally positioned asymmetrically to the azimuthal axis 19 to compensate for any systematic asymmetry in the plasma density distribution, which may be intrinsically present absent the influence of the electromagnet 42. Tailoring the plasma ion flux distribution permits the current density distribution of the ion beam 15 extracted from the plasma 17 to be optimized.

The open end 52 of the pole piece 46 and the open end 49 of the pole piece 48 are mounted with conventional fasteners (not shown) to a ring-shaped magnetic core element 54 of the electromagnet 42. The pole piece 46, the pole piece 48, and the core element 54 are formed from a magnetically permeable material such as low carbon steel, iron, or any other suitable ferromagnetic material and are electrically grounded. In an alternative embodiment, the core element 54 may be fabricated from a nonmagnetic material.

The electromagnet 42 is secured with conventional fasteners between core element 54 and a nonconductive mounting plate 58, which peripherally overlaps the back flange 20. The mounting plate 58 may be secured by conventional fasteners (not shown) to the back flange 20. The electrical insulation strength of mounting plate 58 allows the core element 54 and pole pieces 46, 48 to be electrically grounded without shorting to the back flange 20, which may be permitted to electrically float with the potential of the plasma. The optimum position and dimensions of the electromagnet 42 and re-entrant vessel 44 may depend on characteristics of the plasma and application, such as the required zone of uniformity, RF power, and beam parameters.

The position of the electromagnet 42 may be located (e.g., centered) inside the re-entrant vessel 44 by a ring 60. Ring 60 is fabricated from an electrically insulating material for the same reasons and having the same electrical requirements as mounting plate 58. Suitable electrically insulating materials include but are not limited to a glass epoxy laminate or a phenolic resin. Ring 60 is disposed between the pole piece 48 and sidewall 62. Ring 60 has an outer diameter approximately equal to an inner diameter of the sidewall 62 of the re-entrant vessel 44 to establish a snug fit with close dimensional tolerance and an inner diameter slightly larger than the outer diameter of the pole piece 48. Ring 60 is secured to the pole piece 48 with conventional fasteners.

A plate 64 of an insulating material is interposed between the end wall 56 of the re-entrant vessel 44 and the pole pieces 46, 48 of the electromagnet 42. The insulating material constituting plate 64 may be a polymeric fluorocarbon material such as polytetrafluoroethylene (PTFE), the homopolymer of tetrafluoroethylene commercially available from DuPont under the trade name TEFLON®.

The electromagnet 42 includes a wire bobbin or spool 66, wire coils 72, 74, and the pole pieces 46, 48. Each of the wire coils 72, 74 comprises a continuous winding of an insulated conductor that is wrapped about the wire spool 66 with a suitable solenoidal winding pattern. In specific exemplary embodiments, the number of turns in the wire coils 72, 74 may range from 300 turns to 3000 turns.

The wire spool 66, which may be formed from a polymer resin or other nonmagnetic material, is situated in the gap 50 between the pole pieces 46, 48. The height of the wire spool 66 is shorter than the height of the pole pieces 46, 48. The pole piece 46 includes holes 68 dimensioned to receive setscrews 67 that are tightened to secure the axial position of the wire spool 66 along the azimuthal axis 19. When the setscrews 67 are loosened, the axial location of the wire spool 66 can be shifted toward the end wall 56 of the re-entrant vessel 44 and in an opposite direction toward the core element 54. The wire spool 66 is depicted in FIGS. 1 and 2, for purposes of illustration only, as shifted to an axial position remote from the core element 54 and in close proximity to the end wall 56. Located at opposite ends of the wire spool 66 are radially-extending flanges 76, 78.

In an alternative embodiment, the core element 54 may be omitted from the construction of the electromagnet 42 by selection of a mounting mechanism (not shown) on mounting plate 58 of appropriate mechanical strength. In another alternative embodiment, the axial position of the wire spool 66 may be adjusted in a different manner, such as pins are received in one of a row of appropriately sized openings determinative of different locations relative to the end wall 56. In yet another alternative embodiment, the axial location of the wire spool 66 may be fixed relative to the end wall 56 at an axial location so that the axial position of the wire spool 66 is a controlled variable.

In alternative embodiments, the shape of the back flange 20 may be of any practical geometry, including that of a plate or dome (either re-entrant or non-re-entrant). In such alternative embodiments, the electromagnet 42 may be disposed outside the back flange 20 opposite to the grid assembly 32, within a working distance in which the amplitude of the electromagnetic field generated inside the discharge space 24 by the electromagnet assembly is significant (i.e., at least on the order of the strength of the Earth's magnetic field). In general, the exact shape of the pole pieces 46 and 48 of the electromagnet 42 may be shaped in a manner to conform to the shape of the back flange 20 and/or optimize the magnetic field distribution inside the re-entrant vessel 44.

With continued reference to FIGS. 1 and 2, the wire coils 72, 74 of electromagnet 42 are positioned between the flanges 76, 78 and are centered in a radial direction about (i.e., coaxial with) the azimuthal axis 19. The continuous insulated conductor of the first magnetic wire coil 72 extends between a first end terminal or tap 80 and a second end terminal or tap 82. The continuous insulated conductor of the second magnetic wire coil 72 extends between a third end terminal or tap 84 on wire coil 74 and the second end tap 82, which is shared with the magnetic wire coil 72.

The wire coils 72, 74 of electromagnet 42 are electrically coupled with a power supply 86, which is electrically coupled with a controller 87. The positive and negative voltage polarity terminals of the power supply 86 may be electrically coupled with taps 80, 82 to provide a first range of operation that includes only the continuous conductor of wire coil 72, with taps 80, 84 to provide a second range of operation in which the continuous conductor of wire coils 72, 74 are connected in series, or with taps 82, 84 to provide a third range of operation that includes only the continuous conductor of wire coil 74. A switching device (not shown) may be provided in the power supply 86 to adjust the closed circuit with the wire coils 72, 74 and thereby selectively establish each of the three ranges. Holes 88 are provided in flange 76 of the wire spool 66 to provide access for conductors establishing a closed circuit between the taps 80, 82, 84 and the power supply 86. The conductors are routed through a wireway 96 defined in the core element 54 and mounting plate 58. A guidepost 92 serves as a feed for routing the conductors to the power supply 86.

In an alternative embodiment, the electromagnet 42 may omit one of the two coils 72, 74 such that only a single range of operation exists. The taps of the remaining one of the wire coils 72, 74 are coupled in a closed circuit with the power supply 86 and energized by current from the power supply 86. Power supply 86 is a direct current (DC) power supply or, alternatively, may comprise a pulsed DC power supply or an alternating current (AC) power supply. The power supply settings are controlled by the controller 87, which may be manually operated or part of an automated system.

The controller 87 coordinates the operation of the ion source 10 and, in particular, the operation of the electromagnet 42 with respect to an observable effect of the electromagnet 42 on the beam properties or substrate treatment process. The controller 87 may include a programmable logic controller (PLC), a digital signal processor (DSP), or another microprocessor-based controller with a central processing unit capable of executing software stored in a memory and carrying out the functions described herein, as will be understood by those of ordinary skill. A human machine interface (HMI) device (not shown) is operatively connected to the controller 87 in a known manner. The HMI device may include output devices, such as alphanumeric displays, a touch screen, and other visual indicators, and input devices and controls, such as an alphanumeric keyboard, a pointing device, keypads, pushbuttons, control knobs, etc., capable of accepting commands or input from the operator and transmitting the entered input to the central processing unit of controller 87. The controller 87 may be provided with standard communications busses compatible with other automated equipment utilized in a production line.

The controller 87 may contain an algorithm to adjust the current to one or both of the wire coils 72, 74. In one embodiment, the algorithm may determine the amount of electromagnet current adjustment and may be based on considerations such as the radial effects of the electromagnet 42, acquired performance data as a function of electromagnet current settings, and/or previous magnet current settings to the wire coils 72, 74. In another embodiment, the algorithm may be derived from an experimental matrix (for example, a lookup table) as described in the Examples below. In yet another embodiment, the electromagnet 42 may be regulated by an artificially intelligent circuit employing fuzzy logic and performance data acquired as a function of the electromagnet current settings. In one alternative embodiment, the controller 87 may be directly connected to equipment (i.e., an array of Faraday probes) that measures an etch depth or ion beam current density distribution of an ion beam, allowing the controller 87 to automatically adjust the current from the power supply 86 in response to detecting an undesirable etch depth or beam current density distribution.

The electromagnet 42 generates a magnetic field 75, which includes magnetic induction lines diagrammatically shown in FIG. 1, that has a magnetic field strength approximately proportional to the current supplied to the wire coils 72, 74. The magnetic field 75, which is azimuthally symmetrical about the azimuthal axis 19, changes the plasma density distribution in the discharge space 24, which in turn alters the ion current density uniformity of the ion beam 15. The magnetic field 75 is significantly inhomogeneous, having maximum field strength in the region between the respective open ends 51 and 53 of the pole pieces 46 and 48, diminishing with increasing distance from the open ends 51 and 53, and minimum field strength proximate to the grid 38 and the coil antenna 26. The magnetic field lines are concentrated around the azimuthal axis 19, which indicates the magnetic field strength increases in this region of the discharge space 24, and hence the magnetic field 75 may act on the plasma electrons arriving from the peripheral regions as a magnetic mirror. Such a magnetic field configuration may allow plasma density distribution modifications with minimum RF ionization efficiency reduction (i.e., the region of the discharge space 24 characterized by low field strength near the coil antenna 26) and with minimum ion optics operation distortion (i.e., the region of the discharge space 24 characterized by low field strength near the grid assembly 32).

The magnetic field 75 directly influences the plasma density distribution in the ion source 10 and, therefore, the plasma ion flux distribution directed from the plasma 17 to the grid plane defined by the grid assembly 32. In this manner, the magnetic field 75 generated by the electromagnet 42 influences the characteristics of an ion beam etch depth or current density distribution on the substrate 11. An ion beam etch profile is a measure of the dependence of the etch depth (for example, thickness change) as a function of a positional coordinate (for example, radius) on the substrate 11 after etching by ion beam 15 extracted from the ion source 10. After the conclusion of the etching process (or, alternatively, after partial completion of the etching process), a representative ion beam etch depth distribution, herein referred to in short as the "etch profile," may be generated from a measurement of the thickness change in the etched material as a function of the positional coordinate of substrate 11 (e.g., along the substrate diameter) or of the etch rate of the material, with respect to the azimuthal axis 19. Alternatively, after the above-mentioned etching interval, an average thickness change distribution may be assessed based upon a statistical average of individual thickness change distributions measured on the same substrate and/or more than one substrate.

More generally, the beam ion flux distribution, herein referred to for brevity as the "beam density distribution" or "beam profile," may be determined using a plurality of Faraday probes (not shown) operative to directly measure the ion beam current density during operation of ion source 10 (for simplicity, the case of a single ion charge state is assumed here, therefore the ion flux and current density distributions are equivalent, however with appropriate equipment modifications to resolve the current density distributions of the individual ion charge states the same method may be used for multiple charge state ion beams). The Faraday probes, which have a relative spatial arrangement that permits determination of the ion beam current density distribution with respect to the azimuthal axis 19, are inserted into the path of the ion beam 15 at a position proximate to the substrate processing location, charge is accumulated by each of the Faraday probes for a time interval, and current measurements are calculated. The Faraday probes may be coupled with the controller 87, which supervises the insertion of the Faraday probes into the path of the ion beam 15 and the acquisition of the current measurements.

When the grid spacing and the size and distribution of the apertures 77 in the grid assembly 32 are relatively uniform, a concave or convex plasma ion flux distribution in the ion source 10 will result in a concave or convex ion beam profile between the ion source 10 and substrate 11. However, the beam profile may tend to be more uniform (less concave or convex) than the plasma ion flux distribution in the ion source due to divergence and overlap of individual beamlets. An ideal concave beam ion current density profile is defined here to have a maximum ion current density at the edges of the ion source 10 (i.e., further from the azimuthal axis 19) and decreases in magnitude with decreasing radius from the center of the ion source 10; a ideal convex beam profile is defined exactly in the reverse manner (i.e., a maximum ion current density at the azimuthal axis 19).

Measured ion beam current density distributions may be more complex than these ideal cases, but it is useful for our purposes to generally define a "concave beam profile" as one in which there is a substantially greater ion beam current average density outside of the central half of the beam diameter of interest, and a "convex beam profile" in which there is a substantially greater average current density within the central half of the beam diameter of interest. When the ion beam is normally incident on the substrate and assuming the surface of the substrate 11 is relatively smooth and flat (i.e. any surface irregularities are negligible compared to the etch depth), the etch profile in the substrate 11 obtained as a result of the ion erosion from the ion beam is similar to the ion beam profile and is readily measurable to the desired accuracy with the usual equipment available to a user of the ion beam processing system.

Figure 3A:
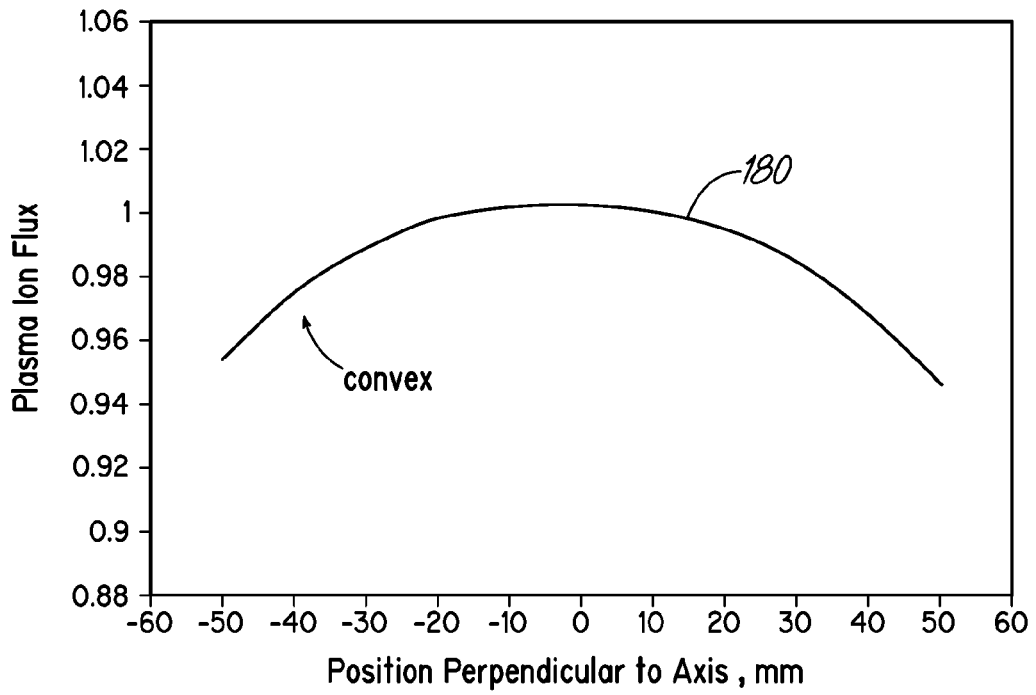
FIG. 3A is a diagrammatic view of the plasma ion flux as a function of radial position relative to the azimuthal axis for the ion source and electromagnet assembly of FIGS. 1 and 2 in which the ion flux is relatively high near the azimuthal axis of the ion source.

FIG. 3A is a diagrammatic illustration of a plasma ion flux distribution 180 at the grid plane 32 for ion beam 15 that may be produced by the ion source 10 of FIGS. 1 and 2. The ion flux profile 180 has a convex radial distribution about the azimuthal axis 19 (i.e., an origin at a position perpendicular to the axis labeled with "0"). Although not wishing to be limited by theory, it is believed that the volumetric inhomogeneous magnetic field 75 introduced by the electromagnet 42 may have two distinct effects on the radial distribution of the ion flux corresponding to two different trends in the effect on the etch profile. At low magnetic field strengths (i.e., low electromagnet currents in coils of the electromagnet), the magnetic field 75 is believed to magnetize the plasma electrons primarily near azimuthal axis 19. This is believed to confine the plasma electrons to long helical orbits around the magnetic induction lines and, hence, increases the working gas ionization efficiency in this region. This results in the convex distribution for profile 180 in which the ion flux is higher at or near the azimuthal axis 19 and decreases with increasing radial distance from the azimuthal axis 19. The resulting convex distribution in the ion flux profile 180 may be centered on the azimuthal axis 19 and may also be symmetrical about the azimuthal axis 19, although the invention is not so limited.

In one embodiment, the ion source 10 may be configured to produce the ion flux profile 180 at low levels of current to the wire coils 72, 74. In this mode of ion source operation, the radial distribution of the plasma ion flux arriving at the grid plane of the grid assembly 32 is convex.

Figure 3B:
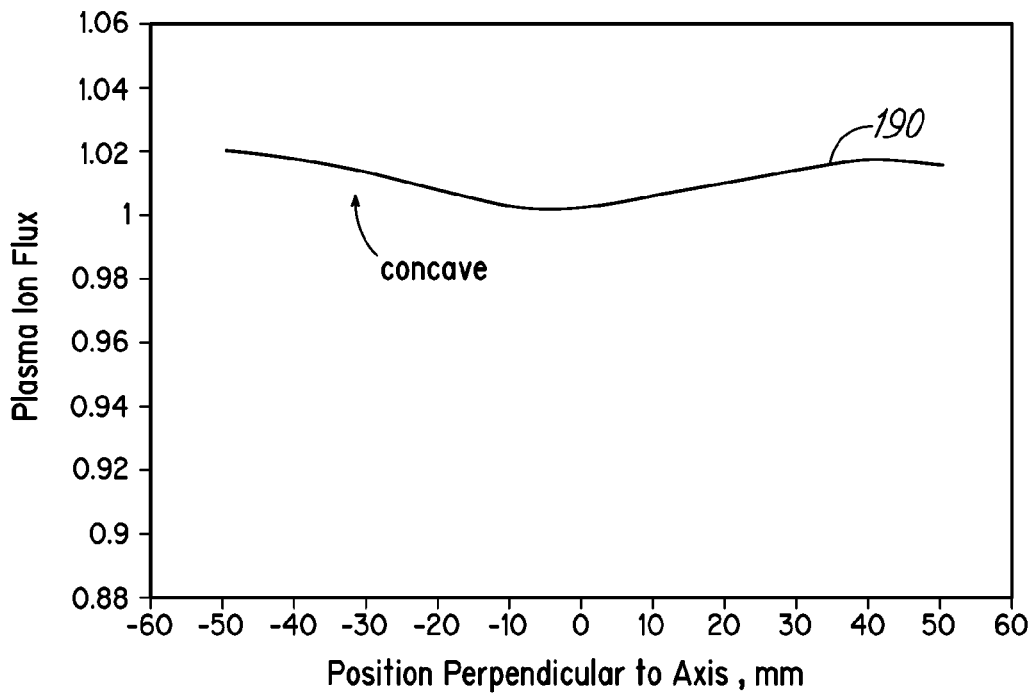
FIG. 3B is a diagrammatic view of a the plasma ion flux for an ion source and electromagnet assembly of FIGS. 1 and 2 in which the ion flux is relatively low near the azimuthal axis of the ion source.

FIG. 3B is a diagrammatic illustration of a plasma ion flux profile 190 at the grid plane 32 for ion beam 15 that may be produced by the ion source 10 of FIGS. 1 and 2. The ion flux profile 190 has a concave radial distribution about the azimuthal axis 19. At higher magnetic field 75 strengths (i.e., higher currents circulating in wire coils 72, 74), some of the hot plasma electrons arriving from the coil vicinity are believed to be reflected from the plasma generator mirroring magnetic field regions, such as near azimuthal axis 19 and open ends 51, 53 (i.e., poles), toward the periphery of the discharge space 24. As a result, the working gas ionization efficiency is believed to be reduced in the plasma generator center (i.e., near azimuthal axis 19 of ion source 10) and to increase at the periphery, and the radial distribution of the plasma ion flux arriving at the grids 34, 36, 38 may become less convex in comparison with the original magnetic field free distribution. This results in the concave distribution exhibited by profile 190 in which the plasma ion flux is lower at or near the azimuthal axis 19 and increases with increasing radial distance from the azimuthal axis 19. The convex distribution in ion flux profile 190 may be centered on the azimuthal axis 19 and may also be symmetrical about the azimuthal axis 19, although the invention is not so limited.

With renewed reference to FIGS. 1 and 2, the magnet current to the wire coils 72, 74 of the electromagnet 42 the ion source 10 may be adjusted to produce a magnetic field 75 adequate to provide a desired etch profile. A useful operating range of the electromagnet 42 may depend on other aspects of the design of the ion source 10, as well as upon the specific etch process conditions and the desired etch profile. The grid assembly 32, which may supply the ion optics in the representative embodiment, may be designed with variable transparency to optimally utilize the electromagnetic tuning capability. For example, the adjustable transparency for the grid assembly 32 can be achieved by varying the density of the apertures 77 in the grid assembly 32 and/or varying the size of the apertures 77 across the grid assembly 32. Manipulating either of these variables pertaining to the apertures 77 may adjust the distribution of ion current emitted across the width of the grid assembly 32 and, ultimately, the shape of the beam profile and the etch depth profile at the substrate 11.

The magnetic field 75 of the electromagnet 42 may be varied during substrate processing of a individual substrate or from one substrate treatment to the next to control the ion beam current density distribution in order to maintain the desired substrate etch rate or etch depth distribution. This variation may be carried out by monitoring the ion beam current density distribution (beam profile) or substrate etch rate or etch depth distribution (etch profile) either in-situ or ex-situ, then tuning or varying the magnetic field 75 to achieve a targeted beam current density distribution and/or etch profile at the substrate 11. For in-situ monitoring, the hardware that is monitoring the substrate etch profile or the hardware that is monitoring the beam profile is disposed inside the process chamber 12a, which provides the option of continuous monitoring and real time adjustments. In an alternative embodiment, this feature may be carried out by monitoring the substrate etch profile "semi-in-situ," i.e., the ion source remains under vacuum while substrate etch profile is obtained from a measurement station incorporated as part of a configuration of vacuum etching equipment. In "semi in-situ" monitoring, the monitoring system is disposed in the same processing station as ion source 10, but in a separate module connected with the process chamber 12a via a vacuum transport system so that the substrate 11 can be transferred without breaking vacuum and the etch profile measured.

To vary the magnetic field 75, the electrical current from the power supply 86 to wire coils 72, 74 may be variable for selectively controlling the field strength of the electromagnet 42 and further selectively modifying the plasma density distribution in the discharge space 24. Substrate processing equipment, or a configuration of vacuum etching equipment, may include an automatic electromagnet magnet power supply controller and etch profile measurement system (whether in-situ, ex-situ, or "semi-in-situ") such that the entire operation may be carried out without need for any action by the user.

The hysteresis effect due to residual or remnant magnetization of the soft magnetic pieces represented by the pole pieces 46, 48 in this construction may not be negligible compared to the desired range of the source electromagnetic field operation. Hysteresis may cause the repeatability of the net magnetic field strength, and thus the etch profile, to be negatively affected. Although this effect can be minimized by careful specification of the material of the components, provision can also be made to reverse the current in wire coils 72, 74 between settings to demagnetize the electromagnet and cancel the remnant magnetic field. In one embodiment, the current to the wire coils 72, 74 is set to zero and an ion beam etch profile is measured. If the ion beam etch profile is determined to show the effects of hysteresis, current at a reverse amplitude as that normally used is sent through the wire coils 72, 74. After a time, the reverse current is shut off and another ion beam etch profile is measured. This process may continue with additional iterations until hysteresis is not discernable.

With specific reference to FIG. 2, in one embodiment a magnetic field probe or sensor 89 may be placed inside of the re-entrant vessel 44 adjacent to the pole piece 46, for example, in an orientation to measure the magnetic field strength perpendicular to the azimuthal axis 19. The sensor 89 may be repositioned within the re-entrant vessel 44 as long as the measured value is at least a large fraction of that reading (e.g., greater than about 50%) and is roughly proportional to that reading over the desired range of magnet currents. When changing magnet current settings, or during a process to eliminate hysteresis, the current to the wire coils 72, 74 is first switched off and the remnant field strength magnitude may be measured on the magnetic field sensor 89.

If the remnant magnetic field strength exceeds an acceptable threshold based upon experimental results or historical performance, a small reverse current is applied to wire coils 72, 74 with the objective of reducing the remnant magnetic field strength. The small magnet current in wire coils 72, 74 is a fraction of the magnitude and opposite in polarity to that which was last applied. The magnet current to the electromagnet 42 is then switched off and the remnant field magnitude is re-measured using magnetic field sensor 89. When the remnant magnetic field strength magnitude remains above the acceptable threshold, the correction process is repeated and the reverse current adjusted until the remnant field strength magnitude is reduced below the acceptable threshold. When the correction process results in a remnant field of opposite polarity because of overcompensation, the correction process may be reversed. If the magnet current is adjusted to a higher magnitude of the same polarity, there is no impact from the hysteresis effect and the demagnetization operation supplied by the correction process may not be necessary.

The magnetic field sensor 89 may also be useful to provide closed loop control of the magnetic field strength for improved process control. In this alternative embodiment, the magnetic field sensor 89 is electrically coupled with controller 87. However, if no magnetic field sensor 89 is incorporated into the ion source 10, the demagnetization process may still be applied. In this instance, a fixed reverse magnet current strength magnitude may be applied for demagnetization, the value of which is determined by, for example, experiment, and typically limited to a range of about 10% to about 30% of the maximum current employed during the previous process.

Figure 4:
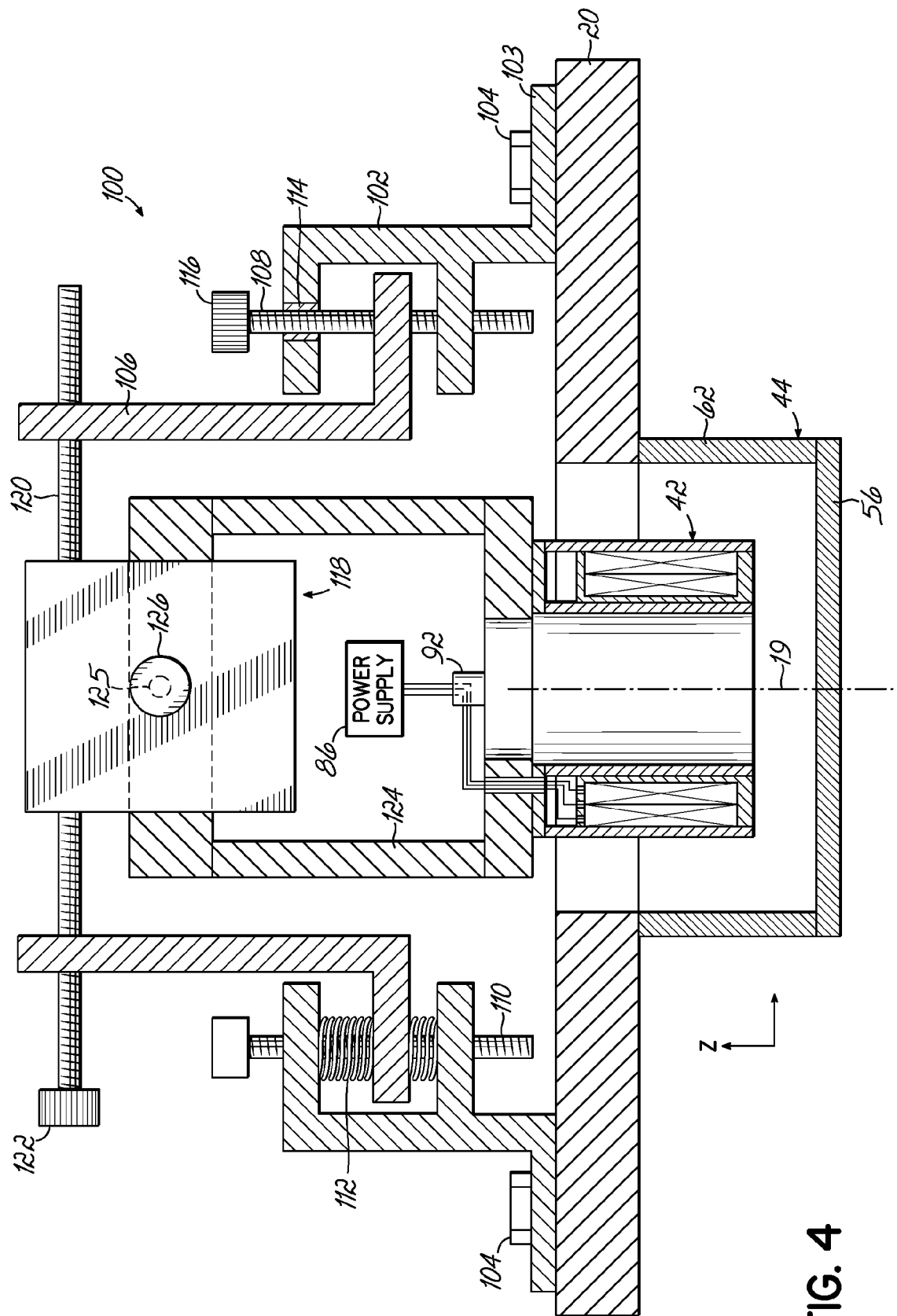
FIG. 4 is an enlarged view similar to FIG. 2 of an ion source and electromagnet assembly, along with a portion of the processing system, in accordance with an alternative embodiment.

With reference to FIG. 4 and in accordance with an alternative embodiment of the invention, the ion source 10 may further include a single or multi-stage positioner, generally indicated by reference numeral 100, configured to allow the electromagnet 42 to travel along an axial direction parallel to the azimuthal axis 19, as limited by the end wall 56, or to travel laterally, as limited by the diameter of the tubular sidewall 18 of re-entrant vessel 44. The positioner 100 provides adjustability of the position of the electromagnet 42 with respect to the plasma volume in discharge space 24.

The positioner 100, which mounts the electromagnet 42 to the back flange 20, may include a series of brackets and adjusting mechanisms that permit independent adjustment of the X,Y,Z position of the electromagnet 42 with respect to the ion source 10 and, in this embodiment, the re-entrant vessel 44. Specifically, the positioner 100 includes a bracket 102, which may be generally cylindrical, having a flange 103 that is mounted to the back flange 20 by a plurality of bolts 104 equally spaced apart on a bolt circle. Another bracket 106 is supported on the bracket 102 by at least one threaded rod 108 and at least one additional support rod 110, which incorporates compliant but structurally supportive spacers 112, such as springs. Where the threaded rod 108 communicates with bracket 102, the threaded rod 108 is supported by a rotary mechanism 114, such as a ball bearing assembly. This rotatable support arrangement permits the location of bracket 102 to be positioned in parallel with the azimuthal axis 19 (defining a first positioning axis "Z") by rotating the rod 108 using a thumbscrew 116.

Mounted on bracket 106 is another bracket 118, whose position is adjustable in a lateral direction perpendicular to the axis via threaded rod 120 using a thumbscrew 122 (defining a second positioning axis "x" not aligned with the first positioning axis "z"). Another bracket 124 is mounted on bracket 118 via a threaded rod 125, such that the position of the bracket 124 is adjustable in a direction perpendicular to the two other axes via a thumbscrew 126 (defining a third positioning axis "y" not aligned with the first positioning axis "z" or the second positioning axis "x"). The electromagnet 42 is mounted to bracket 124.

The (x,y,z) positioning axes may comprise a Cartesian coordinate system with mutually orthogonal axes that supplies at least three degrees of freedom for positioning the electromagnet 42 relative to the back flange 20. However, it is understood that various other frames of reference may be employed for describing and implementing the motion directions of the brackets 102, 106, 118, 124 in a different frame of reference for positioning the electromagnet 42 relative to the back flange 20.

The positioner 100 may have other mechanical constructions understood by a person having ordinary skill in the art. In an alternative embodiment, the positioner 100 may be automated by, for example, replacing the manually-manipulated thumbscrews 116, 122, 126 with a powered drive system, such as stepper motors, servo motors, or the like, that is electrically coupled with the controller 87. The powered drive system would be operated by electrical signals derived from programmed instructions from, for example, a software algorithm resident on the controller 87.

Figure 5:
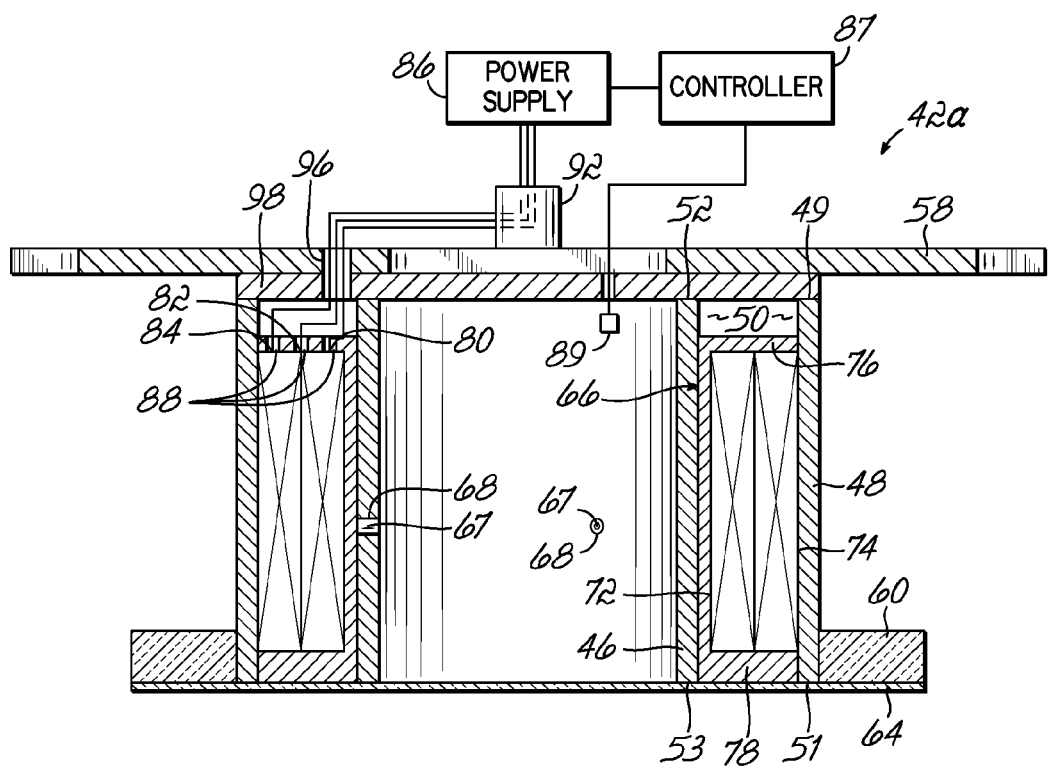
FIG. 5 is an enlarged view similar to FIG. 2 of an electromagnet assembly in accordance with an alternative embodiment.

With reference to FIG. 5 in which like reference numerals refer to like features in FIG. 2 and in accordance with an alternative embodiment of the invention, an electromagnet 42a modifies electromagnet 42 to include a solid disk-shaped core element 98 coupled with the pole pieces 46, 48 and unbroken but for the wireway 96. Core element 98, which replaces core element 54, bridges the gap between the open end 49 of pole piece 48 and the open end 52 of the pole piece 46. The core element 98 also closes the bore radially inside the open end 52 of the pole piece 46. The core element 98 is formed from magnetically permeable material and is conventionally fastened to the mounting plate 58.

Figure 6:
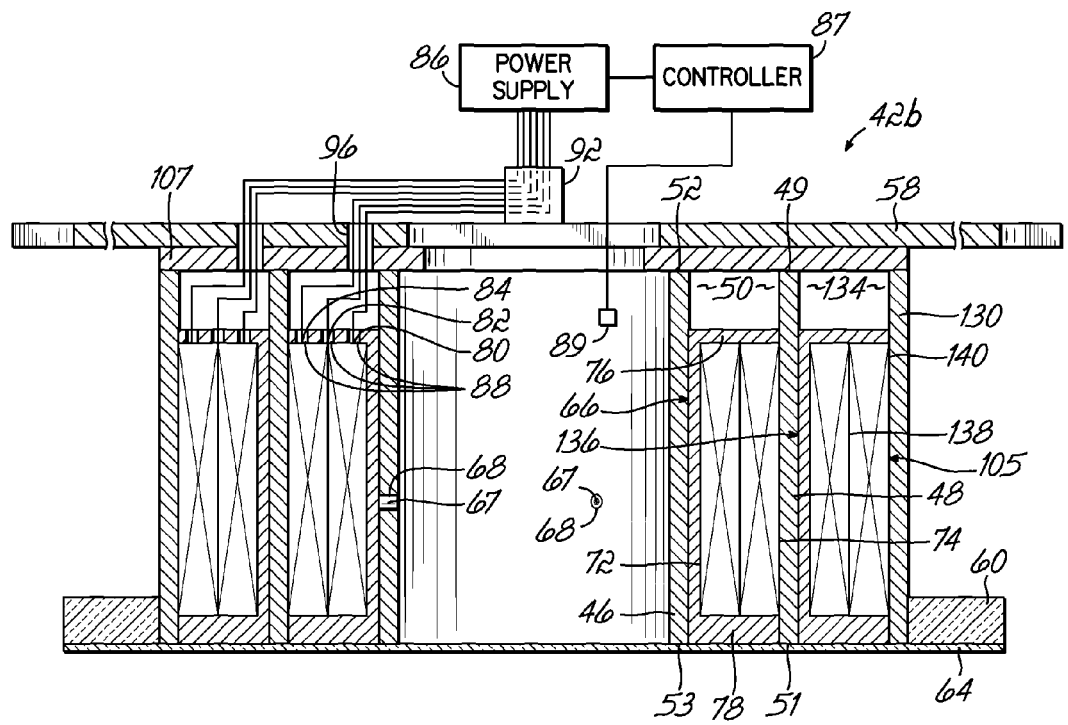
FIG. 6 is an enlarged view similar to FIGS. 2 and 5 of an electromagnet assembly in accordance with an alternative embodiment.

With reference to FIG. 6 in which like reference numerals refer to like features in FIG. 2 and in accordance with an alternative embodiment of the invention, an electromagnet 42b, which is similar to electromagnet 42a, includes an additional pole piece 130. The pole piece 130 is concentrically arranged with the pole pieces 46, 48 such that the pole piece 48 is disposed radially between pole pieces 46 and 130. The pole pieces 46, 48, 130 extend axially from an annular core element 107. Pole piece 130 and the core element 107 are also formed from a magnetically permeable material such as low carbon steel, iron, or any other suitable material. Disposed in a gap or open space 134 between pole pieces 48, 130 are additional wire coils 138 and 140 and a wire bobbin or spool 136, which along with wire coils 72, 74 and wire spool 66 collectively define electromagnet 42a. The wire spool 136 is substantially identical to wire spool 66, and a pair of wire coils 138, 140 are substantially identical to wire coils 72, 74.

The wire coils 138, 140 are disposed at a greater radius relative to azimuthal axis 19 (FIG. 1) than wire coils 72, 74 of electromagnet 42. Wire coils 138, 140 may be energized independent of wire coils 72, 74, such that the impact of the magnetic field 75 on plasma 17 (FIG. 1) can be distributed over a larger or smaller diameter relative to azimuthal axis 19. The radial distribution may be contingent upon the etch requirement. The independent field generation can be provided by energizing only coils 72, 74, by energizing only wire coils 138, 140, by switching between one set of wire coils 72, 74 and the other set of wire coils 138, 140, or energizing all wire coils 72, 74, 138, 140 simultaneously while utilizing independent magnet current settings.

In an alternative embodiment, the electromagnet 42b may omit one of the two wire coils 72, 74 and/or one of the two wire coils 138, 140 such that only a single range of operation exists for each coil set. In this alternative embodiment, two taps of the remaining one of the wire coils 72, 74 are coupled in a closed circuit with the power supply 86 and energized by current from the power supply 86. Similarly, two taps of the remaining one of the wire coils 138, 140 are coupled in a closed circuit with the power supply 86 and energized by current from the power supply 86.

Figure 7:
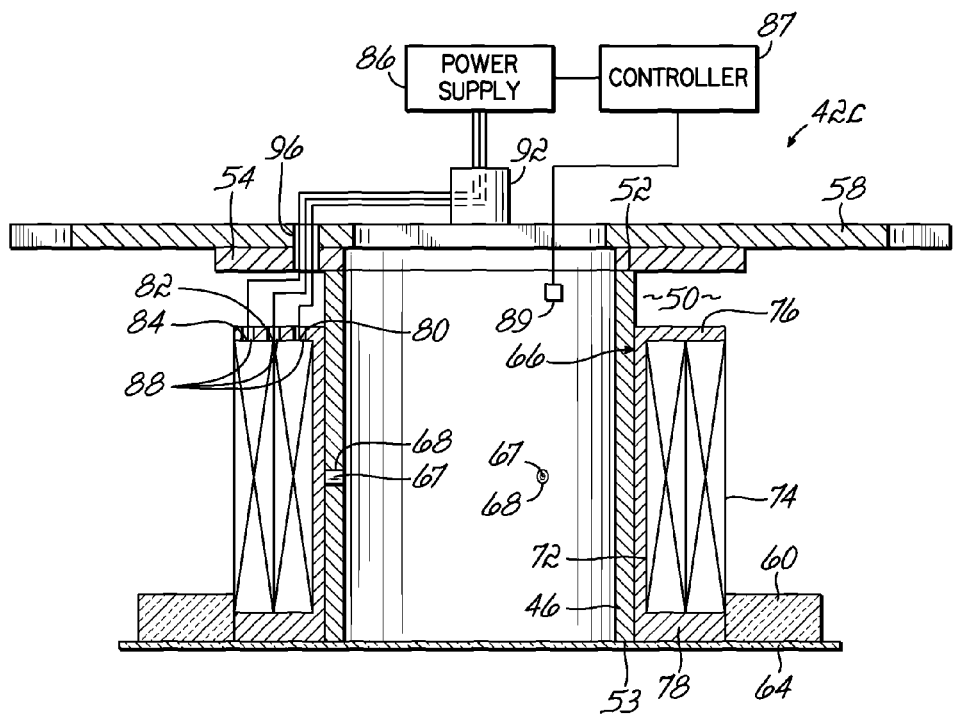
FIG. 7 is an enlarged view similar to FIGS. 2, 5, and 6 of an electromagnet assembly in accordance with an alternative embodiment.

With reference to FIG. 7 in which like reference numerals refer to like features in FIG. 2 and in accordance with an alternative embodiment of the invention, an electromagnet 42c omits the pole piece 48 so that the wire coils 72, 74 are disposed radially outside the pole piece 46. As a result, the wire coils 72, 74 are radially flanked only on their inner diameter (relative to the azimuthal axis 19 (FIG. 1) by magnetically permeable material that shapes and concentrates the magnetic field emitted from the energized wire coils 72, 74.

Figure 8:
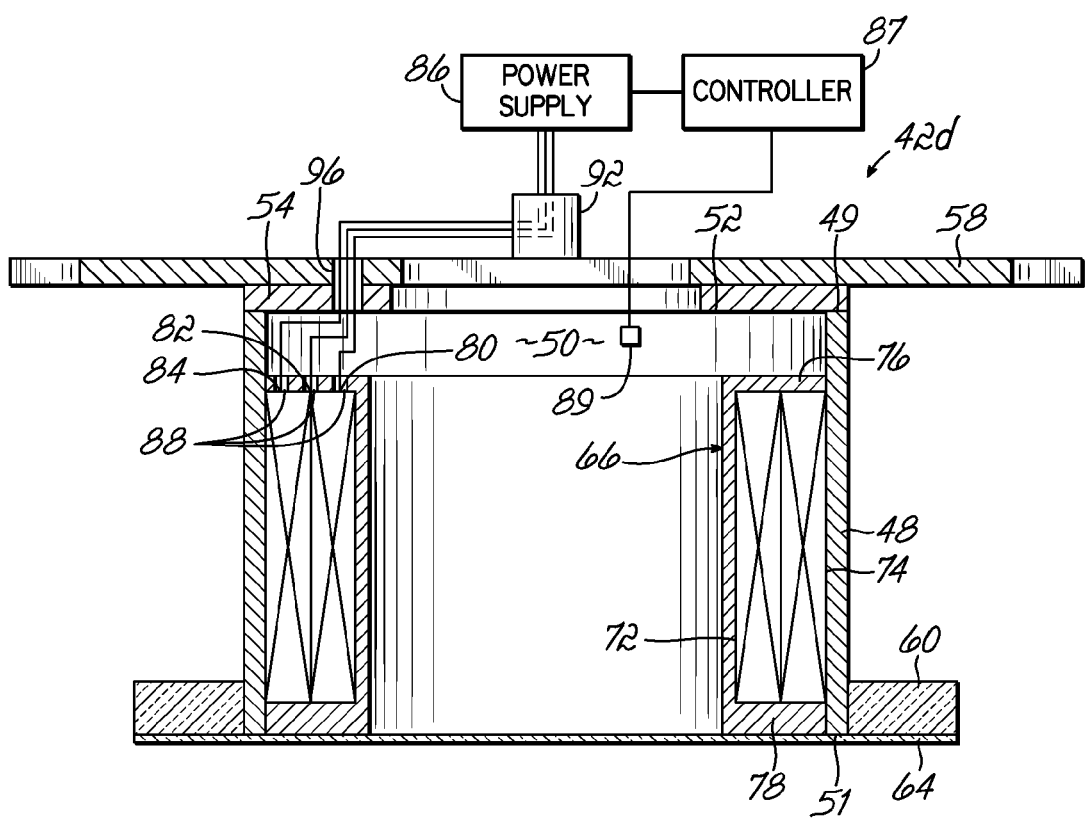
FIG. 8 is an enlarged view similar to FIGS. 2 and 5-7 of an electromagnet assembly in accordance with an alternative embodiment.

With reference to FIG. 8 in which like reference numerals refer to like features in FIG. 2 and in accordance with an alternative embodiment of the invention, an electromagnet 42d omits the pole piece 46 so that the wire coils 72, 74 are disposed radially inside the pole piece 48. As a result, the wire coils 72, 74 are radially flanked only on their outer diameter (relative to the azimuthal axis 19) by magnetically permeable material effective to shape, direct, and concentrate the magnetic field emitted from the energized wire coils 72, 74.

Further details and embodiments of the invention will be described by way of the following examples.

Example 1

An ion source having an electromagnet assembly, otherwise substantially identical to electromagnet 42b (FIG. 6) but with each of the inner and outer coils including a single coil of 970 turns, was equipped with an ammeter between the coil of the radially innermost electromagnet and power supply for purposes of measuring the current supplied to the radially outermost coil of this electromagnet 42b. The coil of the radially outermost electromagnet was disconnected from the power supply so that only the innermost coil of the electromagnet 42b was energized. An electrical probe was inserted into the beam and situated in the substrate plane perpendicular to the beam incidence direction. A voltage was measured from the electrical probe, which was charged under the substrate processing conditions. This voltage was considered as a measure of the broad ion beam neutralization.

A 1200 V, 650 mA beam of positively charged ions was extracted from an argon gas plasma. While propagating toward the substrate, the ion beam was neutralized utilizing a plasma bridge neutralizer. A series of silicon oxide coated silicon wafers were etched at normal incidence at different ion source electromagnet current settings, $I_{MAG}$. The electromagnet current setting, $I_{MAG}$, was systematically varied in 0.1 ampere (A) increments. The ion beam from the ion source was directed at normal incidence to a statically held substrate to etch a portion of the silicon oxide layer. The etch rate at different locations on the substrate was calculated as the ratio of the measured etch depth (change in the oxide layer thickness) to etch time. The relative etch rate indicated in Table 1, represents the average etch rate divided by the average etch rate with a zero magnet coil current. It is advantageous to measure an etch rate with a value of zero magnet coil current before developing any knowledge of the effect of the electromagnet at the chosen process parameters and ion source etching system configuration. The change in oxide layer thickness was determined by pre- and post-etch optical spectrophotometry measurement. The RF power and probe voltage were measured for each value of the magnet current, $I_{MAG}$ and normalized to the corresponding values at zero magnet coil current. The probe voltage is representative of the level of neutralization of the broad ion beam.

TABLE 1

| $I_{MAG}$ | Uniformity (3 σ/Avg) | Relative Etch Rate | Relative RF Power | Relative Probe Voltage |
|---|---|---|---|---|
| 0 | 2.19% | 1.00 | 1.00 | 1.00 |
| 0.1 A | 3.13% | 1.00 | 1.01 | 1.03 |
| 0.2 A | 3.32% | 1.01 | 1.03 | 1.04 |
| 0.3 A | 5.85% | 1.08 | 1.07 | 1.09 |
| 0.4 A | 6.11% | 1.09 | 1.06 | 1.04 |
| 0.5 A | 4.83% | 1.07 | 1.06 | 1.04 |
| 0.6 A | 4.57% | 1.08 | 1.09 | 1.09 |
| 0.7 A | 4.25% | 1.07 | 1.12 | 1.09 |
| 0.8 A | 3.68% | 1.06 | 1.13 | 1.10 |
| 0.9 A | 3.21% | 1.05 | 1.16 | 1.13 |
| 1 A | 3.70% | 1.05 | 1.17 | 1.10 |
| 1.2 A | 1.56% | 1.00 | 1.18 | 1.12 |
| 1.3 A | 1.30% | 1.00 | 1.18 | 1.19 |
| 1.4 A | 1.30% | 0.98 | 1.19 | 1.17 |

As indicated in Table 1, one metric for evaluating the shape of the etch depth profile which is appropriate when it is desired to etch the substrate uniformly is the "three sigma" etch rate "uniformity" (three times the standard deviation from the mean or average value divided by the mean) variation in the etch rate, expressed as a percentage. As apparent from the tabulated data, the uniformity of the etch rate worsens as the magnet current is raised from 0 A to 0.4 A. Above 0.4 A, the uniformity progressively improves as the magnetic field flattens the etch profile. As apparent from the tabulated data, the etch uniformity at magnet currents of 1.2 A, 1.3 A, and 1.4 A is improved in comparison with the etch uniformity at an electromagnet current of 0 A. The high degree of etch uniformity that can be achieved by this method (less than 3% three sigma) on statically held substrates indicates that when electromagnet assembly is tuned, the introduction of an external magnetic field via the electromagnet of the invention smoothes out local variations in the plasma density.

As is apparent from Table 1, the measured etch rate is weakly dependent on the electromagnet current. There is a slight effect, which can be compensated, if required, e.g. by appropriate adjustment of the etch time. This effect may be also usefully employed to tune the etch rate of the ion source rather than the etch profile, for example to match the etch rate in one module with that in another, although the practical use of such a method would depend on the sensitivity of the process to the resulting change in the etch profile. The presence of the magnetic field from the magnet assembly increases the RF power with increasing field strength (i.e., increasing electromagnet current). However, the observed increase in the RF power can be tolerated without a significant reduction in source efficiency over the entire range of electromagnet currents.

The uniformity in the etch rate profile can be related to the shape and/or uniformity of the ion beam used to generate the etch profile. As a result, the variation in the profile of the ion beam is linked to the shape of the etch rate or etch depth profile.

Example 2

As evidence that the operation of the electromagnet under controlled conditions does not degrade the ion beam directionality, the "local divergence angle" of the angular distribution of the ions was evaluated for optimum electromagnet current settings at different positions in the beam and compared with equivalent results obtained without the electromagnet for the same process parameters. The "local divergence angle" was determined by etching a substrate beneath a masking aperture and measuring the size of the etch spot, essentially as described by J. R. Kahn, et al, J. Vac. Sci.

Technol. A14(4), July/August 1996, p. 2106-2112 (ref. FIG. 1), except that a silicon dioxide coated silicon wafer was used as the substrate and a nanospectrophometric measurement apparatus (Nanometrics Nanospec™ 8000) capable of high resolution etch depth and lateral position measurement was used to determine the etch depth profile. The disclosure of this publication is hereby incorporated by reference herein in its entirety. The substrate was etched using the ion source of Example 1 operating at a magnet current of 1.3 A.

As shown in Table 2, the divergence angle was evaluated at two different positions on the etched silicon dioxide layer, both at normal incidence to the beam and downstream of the grid plane by about 9 inches. One position is at radius R=0 on the center axis of the beam, and the second position is at radius R=2.5", which is offset from the center of the beam by 2.5 inches. The estimated error of the divergence angle measurements is about ±0.5°. As shown in Table 2, there is no evidence of significant degradation of the beam directionality arising from electromagnet operation for the chosen operating conditions.

TABLE 2

| Beam Voltage | Beam Current | Relative Local Divergence Angle With electromagnet (optimized magnet current) | |
|---|---|---|---|
| Volts | mA | R = 0 (center) | R = 2.5" |
| 100 | 180 | 0.95 | 0.95 |
| 100 | 270 | 1.05 | 1.00 |
| 1200 | 650 | 0.93 | 1.00 |

Example 3

Figure 9:
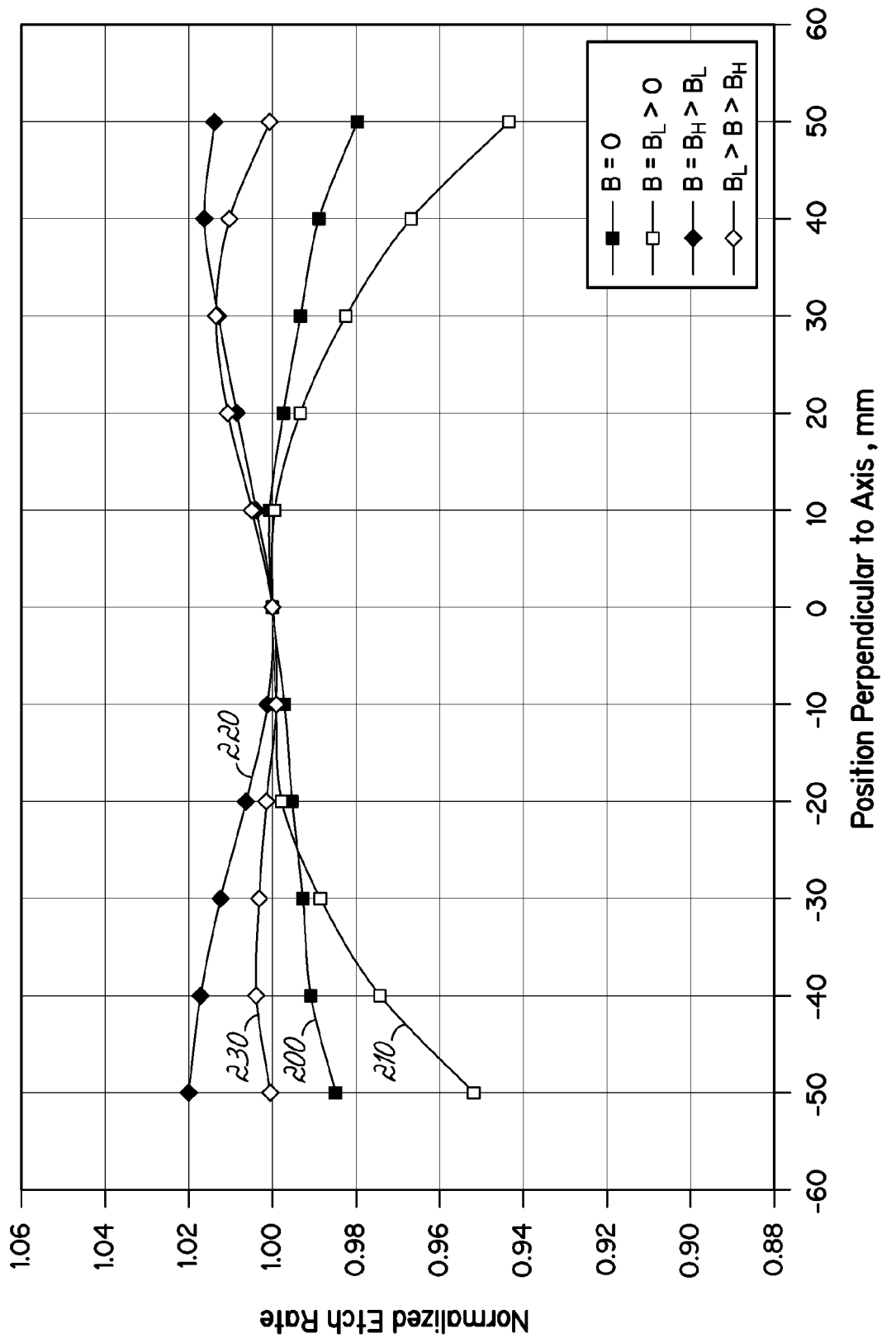
FIG. 9 is a diagrammatic view illustrating the effect of the electromagnetic field generated by an ion source of an embodiment of the invention on the normalized ion beam etch rate profile.

A series of ion etch profiles, which have been normalized for presentation, were generated using the ion source and operating parameters (except for the current applied to the electromagnet) of Example 1 and are shown in FIG. 9. With no current applied to the coils of the electromagnet (and therefore no field strength), the plasma density distribution and the distribution of plasma ion flux are characterized by a convex profile, which is reflected in the ion etch profile of curve 200. At a relatively low field strength, $B_L$, the plasma density distribution and the distribution of plasma ion flux increase in convexity with increasing field strengthen, as reflected in the ion etch profile of curve 210. At a relatively high field strength, $B_H$, the plasma density distribution and the distribution of plasma ion flux changes shape to become more concave with increasing field strength. Eventually, the plasma density distribution and the distribution of plasma ion flux change to a concave shape, as reflected in the ion etch profile of curve 220.

At a magnetic field strength, B, between the relatively low field strength, $B_L$, and relatively high field strength, $B_H$, the plasma density distribution and the distribution of plasma ion flux will be substantially flat, i.e. not convex or concave, as reflected in the etch profile of curve 230. This behavior allows the overall shape of the etch profile, as well as the plasma density distribution and the distribution of plasma ion flux, to be tailored to a desired shape, and in particular is very favorable to being able to produce very uniform etching characteristics. As compared to prior art radiofrequency ion beam source control method embodiments, the capability of the ion source of the invention to tailor the plasma density distribution using an electromagnetic field potentially allows it to be used over a wider range of beam parameters, or to be used with different grid designs, or achieve a wider range of desired beam profiles.

Example 4

The following is an example of how the magnetic field generated by the electromagnet may be used to "re-tune" the ion beam density profile for a given ion beam processing configuration to re-optimize it for the effects of variation in the operating conditions. "Ion beam processing configuration" refers to the ion beam processing system design and operating parameters. The "ion beam processing system design" includes the mechanical and electrical configuration of the ion beam processing system components, including the ion source embodiment 10, grid assembly 32 design, process chamber, and vacuum pumping system design. "Operating parameters" here refers to all of the equipment settings, including the ion beam grid voltages, beam current, etch angle, and gas flowrate, and processing area of interest (e.g., usable substrate diameter) other than the electromagnetic setting itself. "Operating conditions" refer to the particular set of circumstances that can affect the density profile associated with any particular processing tool at any particular time. For example, variations may be due to the tolerance variations in the construction of the specific ion generator unit (plasma source), including the particular electromagnet unit, the specific unit grid set, and the particular process chamber, including the specific vacuum pump. Alternatively, they may be due to the "aging" effects on these components since they were first installed and last serviced. The electromagnet current, $I_{MAG}$, may be optimized initially by generating a knowledge base of the typical relative influence of the electromagnet 42 for a particular ion beam configuration operated at a reference set of operating conditions. The knowledge base may be used to select a nominal value for the electromagnet current, $I_{NOM}$, likely to achieve a desired ion beam etch rate profile at the reference conditions.

Figure 10:
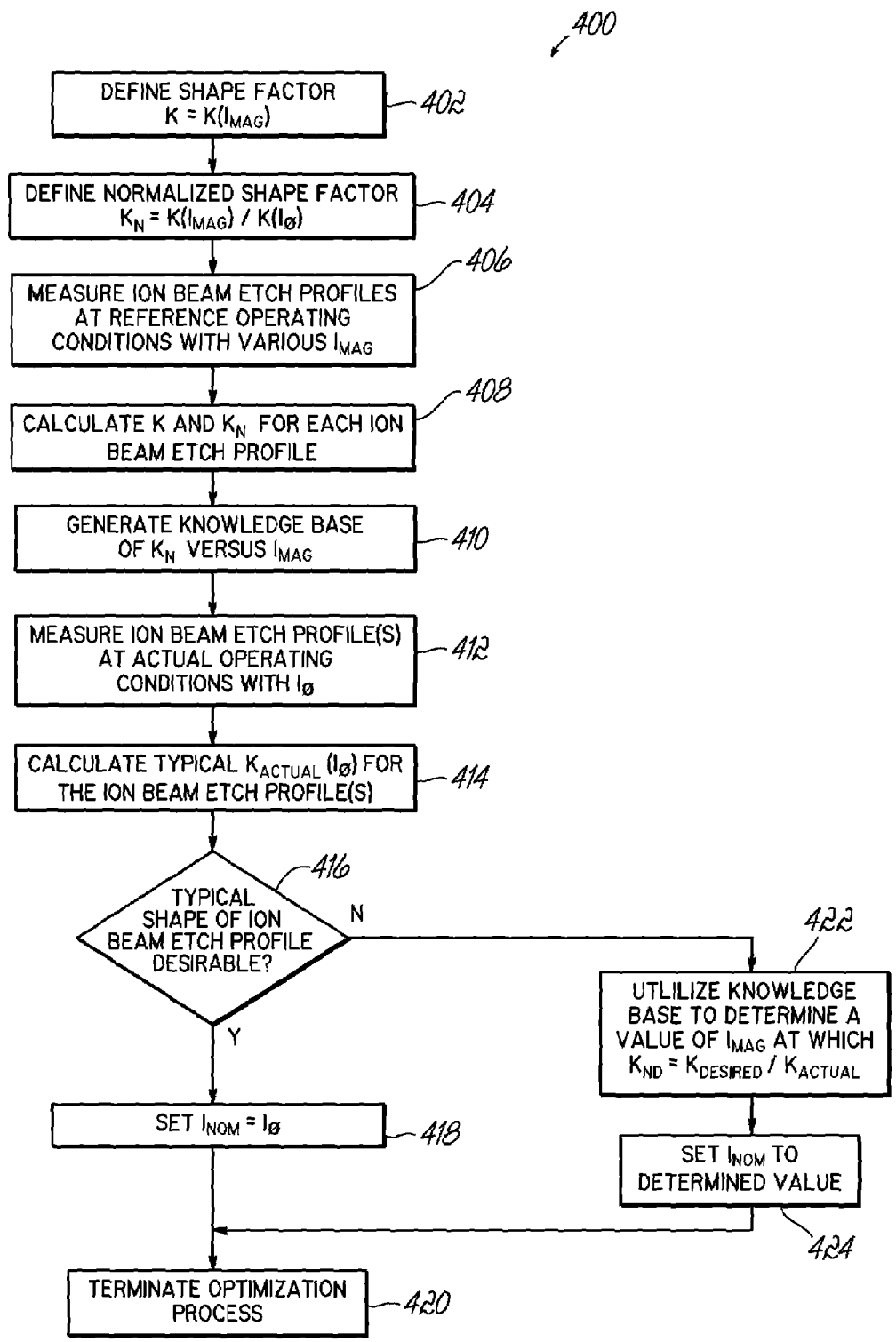
FIG. 10 is a flowchart of a process for optimizing the electromagnet current for an ion source with an electromagnet in accordance with an embodiment of the invention.

FIG. 10 diagrammatically illustrates a method 400 that may be used to optimize the electromagnet current, $I_{MAG}$, for ion source 10 for other operating conditions in accordance with an embodiment of the invention. In block 402, a distribution profile in the representative form of a shape factor, K, is defined as a measure of the convexity or concavity of the ion beam etch profile. This shape factor may be for example the ratio of the average ion beam current density in the beam for measured points within a certain inner radius "$r_0$" to the average current density for measured points at radii between of $r_0$ and the maximum usable radius. The shape factor, K, may be defined to correspond to unity when there is a substantially flat etch profile, an increasing value greater than one (K>1) corresponding to an increasingly convex etch profile, and a decreasing value less than one (K<1) corresponding to an increasingly concave etch profile. For a given ion beam processing configuration and a given set of operating parameters, the shape factor, K, may be provided as a function of $I_{MAG}$ (i.e., $K=K(I_{MAG})$) for a reference set of conditions.

In block 404, a normalized shape factor, $K_N$, is defined as a value of shape factor, K, at each different electromagnet current, $I_{MAG}$, divided by the value of shape factor, K, at a reference electromagnet current, $I_0$. $I_0$ may be defined as zero current, corresponding to a state in which the electromagnet is turned off. The normalized shape factor, $K_N$, may thus be defined as follows:

$$K_N = K(I_{MAG})/K(I_0)$$

In block 406, ion beam etch profiles of the ion source 10 are measured at reference operating conditions with various values of electromagnet current, $I_{MAG}$. In one embodiment of block 406, substrates 11 are etched with the ion source 10 with reference operating conditions at various values of electromagnet current, $I_{MAG}$, the resultant ion beam etch profiles of each substrate are measured, and each ion beam etch profile is associated with its corresponding electromagnet current, $I_{MAG}$. In an alternate embodiment, a plurality of Faraday probes may be used to directly measure a spatial distribution for the ion beam current density profile of the ion source 10 with reference operating conditions and at various values of electromagnet current, $I_{MAG}$. In block 406, one value of electromagnet current, $I_{MAG}$, may be chosen to be the reference electromagnet current, $I_0$. In block 408, values for the shape factor, K, and the normalized shape factor, $K_N$, are calculated for each ion beam etch profile measured in block 406. The controller 87 may be used to calculate the values for the shape factor, K, and the normalized shape factor, $K_N$, for each ion beam etch profile.

In block 410, a knowledge base is generated that contains information pertaining to the relative effect of electromagnet current on the ion beam etch rate profile for a given ion beam processing system and set of operating parameters. The knowledge base may take the form of a table or a graphical representation (i.e., such as that shown in FIG. 11 and described later). The knowledge base may reside in a memory of the controller 87.

In block 412, one or more ion beam etch profiles of ion source 10 are measured at the reference electromagnet current value, $I_0$ under "actual" operating conditions corresponding to the particular ion beam processing unit and it's particular condition at the time of interest. In block 414, an actual shape factor, $K_{ACTUAL}(I_0)$, is defined as the value of the shape factor, K, at the reference electromagnet current, $I_0$, with actual operating conditions. In block 416, the actual shape factor, $K_{ACTUAL}(I_0)$, is evaluated to determine whether it indicates that the ion beam etch profile is within desired limits at the reference current $I_0$ (i.e., if the actual shape factor, $K_{ACTUAL}(I_0)$, is approximately unity, indicating the ion beam etch profile is neither essentially concave nor convex, where a uniform etch process is desired). When the actual shape factor, $K_{ACTUAL}(I_0)$, indicates the ion beam etch profile is desirable at the reference current $I_0$, the nominal electromagnet current, $I_{NOM}$, is set to the reference electromagnet current $I_0$ ($I_{NOM}=I_0$) in block 418. In block 420, the method 400 for electromagnet current optimization is terminated.

The controller 87 may be used to perform the process optimizing the electromagnet current. The controller 87 may make the evaluations of actual and desired shape factors based upon a suitable algorithm executing on the CPU of the controller 87.

When the actual shape factor at the reference current $I_0$, $K_{ACTUAL}(I_0)$, indicates an undesirable ion beam etch profile is obtained at the reference current (i.e., $K_{ACTUAL}(I_0)$ is not approximately equal to unity when a uniform etch process is desired), the knowledge base obtained from the reference conditions is utilized to determine a setting of the electromagnet current, $I_{MAG}$, that results in a desirable ion beam etch profile in block 422 (thus avoiding the needed to re-evaluate the shape factor at different magnetic currents to optimize the density profile for the actual operating conditions). The knowledge base may be utilized to find a value of the electromagnet current, $I_{MAG}$, at which a desired normalized shape factor, $K_{ND}$, is equal to the ratio of the desired shape factor, $K_{DESIRED}$, divided by the actual shape factor at the reference current, $K_{ACTUAL}(I_0)$. Generally, the desired shape factor $K_{DESIRED}=1$ when a uniform etch process is desired, although the invention is not so limited. The desired normalized shape factor, $K_{ND}$, may be defined as follows:

$$K_{ND}=K_{DESIRED}/K_{ACTUAL}(I_0)$$

Figure 11:
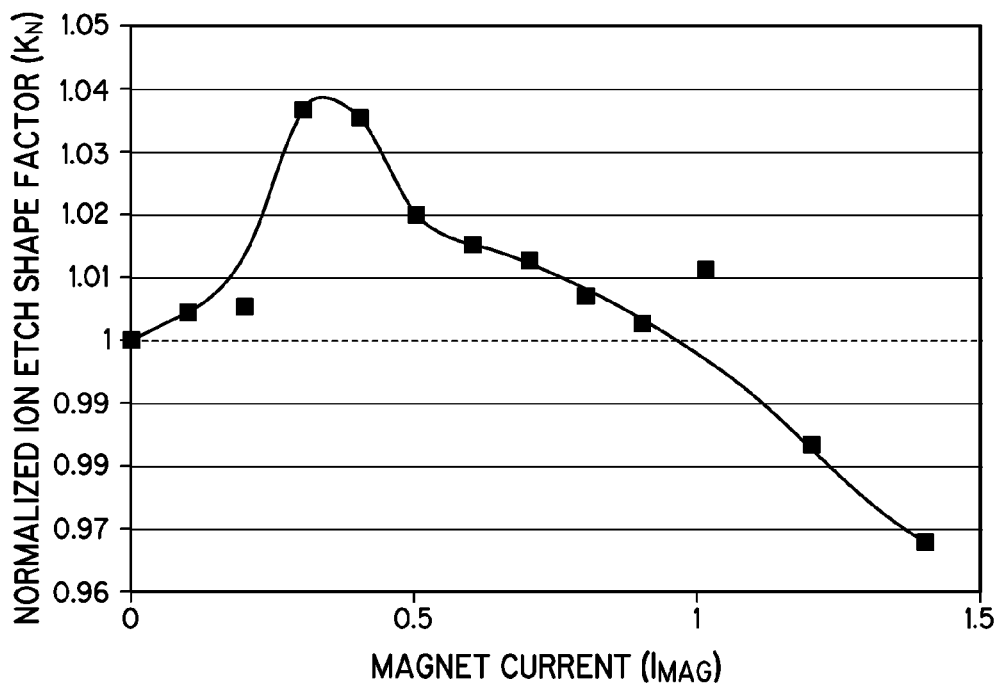
FIG. 11 is a graphical representation showing the convexity and concavity of a normalized ion beam etch profile as a function of magnet current.

FIG. 11 is a graphical representation of a knowledge base of the relative effect of magnet current on ion beam etch profiles, and graphically illustrates the relationship between the electromagnet current, $I_{MAG}$, and the normalized shape factor, $K_N$. This graphical representation may be utilized to reference the value of electromagnet current, $I_{MAG}$, at which the desired shape factor, $K_{ND}$, is equal to ($K_{DESIRED}/K_{ACTUAL}(I_0)$) (i.e., $K_{DESIRED}=1$ when a uniform etch process is desired). When the resultant value of the electromagnet current, $I_{MAG}$, is not within the practical range of operation of the electromagnet 42 or power supply 86, the nominal electromagnet current, $I_{NOM}$, may be set to the value for which the normalized shape factor, $K_N$, is closest to (i.e., resembles) the desired normalized shape factor, $K_{ND}$. When there is more than one value of the electromagnet current, $I_{MAG}$, or the normalized shape factor, $K_N$, that results in a desirable etch profile, any electromagnet current, $I_{MAG}$, that provides this condition may be chosen for the nominal electromagnet current, $I_{NOM}$.

For example, the knowledge base illustrated in FIG. 11 may be referenced to find the nominal electromagnet current, $I_{NOM}$, when the actual shape factor, $K_{ACTUAL}(I_0)$, is equal to 0.98 (indicating, for example, that the ion beam etch rate profile is concave) and the desired shape factor, $K_{DESIRED}$, is equal to 1 (when a uniform etch process is desired) at $I_0$. The desired normalized shape factor, $K_{ND}$, is thus calculated to be $K_{ND}=(1)/(0.98)$, or the desired shape factor, $K_{ND}$, would equal 1.02. As shown in FIG. 11, there are at least two values of the electromagnet current, $I_{MAG}$, in the database that correspond to $K_N=1.02$. Either of these values of the electromagnet current, $I_{MAG}$, may be chosen (i.e., the $I_{MAG}$ may be set to 0.345 Amperes or to 0.5 Amperes) as the nominal electromagnet current, $I_{NOM}$, and be considered to result in the substantially flat etch rate profile in which a uniform etch process is desired.

Referring back to FIG. 10, in block 424, the nominal electromagnet current, $I_{NOM}$ is set to the electromagnet current, $I_{MAG}$, at which the desired shape factor, $K_{ND}$, is equal to ($K_{DESIRED}/K_{ACTUAL}$) to optimize the flatness of the ion beam etch profile. In block 420, the process for electromagnet current optimization is terminated.

Example 5

Figure 12:
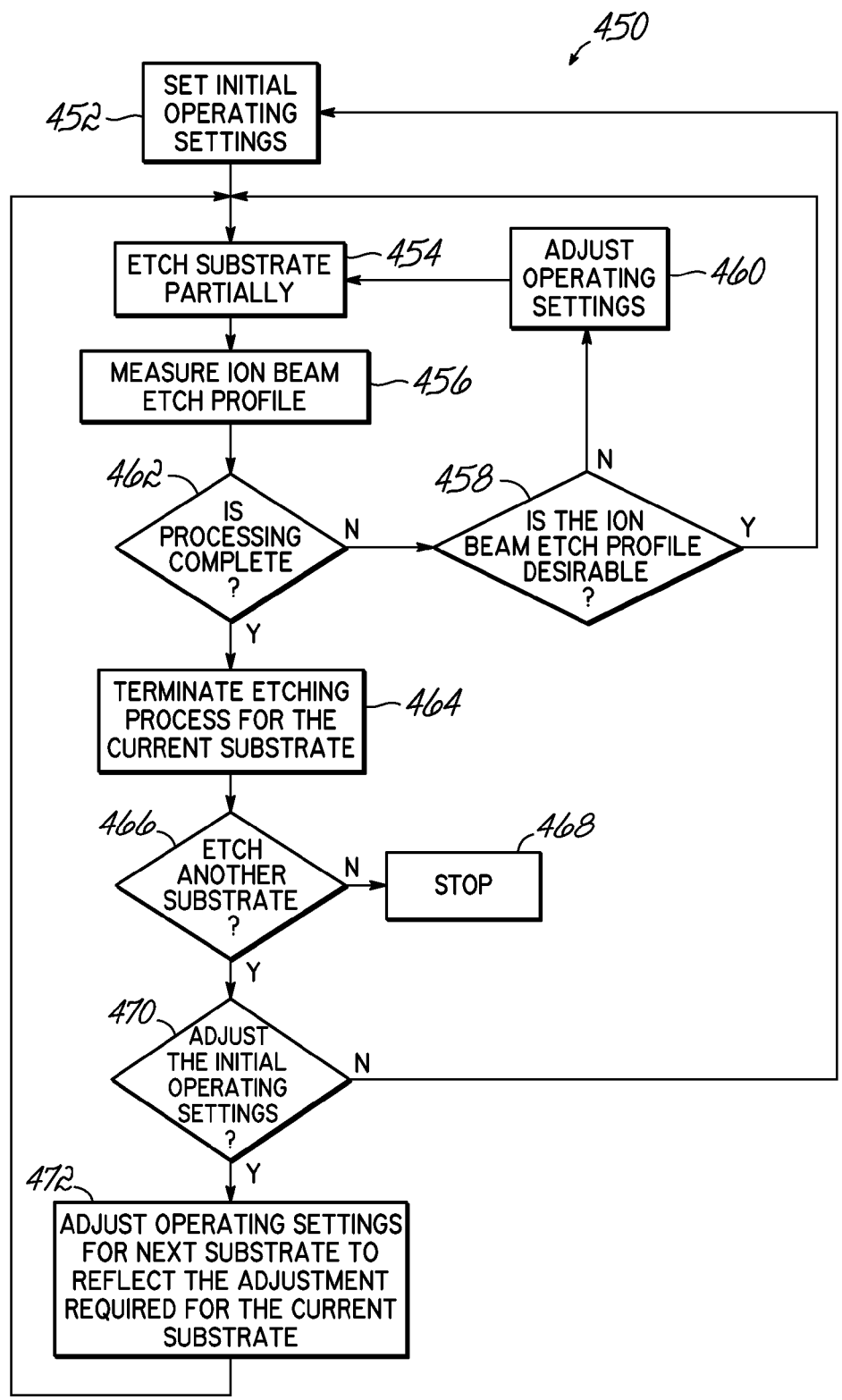
FIG. 12 is a flowchart of a process for re-optimizing the electromagnet current for an ion source in which the ion beam etch rate profile is not within desired limits in accordance with an embodiment of the invention.

In one embodiment, the electromagnet current, $I_{MAG}$, may be optimized by adjusting it in discrete stages to produce the desired etch profile (i.e. substantially flat profile when a uniform etch process is desired). FIG. 12 is an illustration of a routine 450 for optimizing the electromagnet current, $I_{MAG}$, in discrete stages by incrementing the electromagnet current and measuring an effect associated with the incremental adjustments. In block 452, operating parameters for the ion source 10 are set. Operating parameters may include an initial value of the electromagnet current, $I_{MAG}$, which may be derived from a knowledge base generated as described in Example 4. In block 454, the ion source 10 is used to partially etch a substrate 11. In block 456, the ion beam etch profile is measured.

In block 462, the ion beam etch profile is analyzed to determine whether the etching process is complete based upon the measurement acquired in block 456. Preferably, this is determined by measurement of the actual etch depth at the same time as the etch profile, but it may also be determined based on the average etch rate and the cumulative etch time. If it is determined that the etching process has not concluded, the substrate is partially etched again in block 454, and the above sequence is repeated. When the etching process is completed, control is transferred from block 462 to block 464 to terminate the adjustment of the electromagnet current, $I_{MAG}$, in discrete steps and, potentially, to etch another substrate with the same technique.

If the etching process is not complete, the ion beam etch profile is analyzed in block 458 to determine whether it is desirable (i.e., if the ion beam etch profile is approximately flat when a uniform etch process is desired). If the ion beam etch profile is undesirable, the operating settings are adjusted in block 460. Adjustment of the operating settings may include incrementally increasing or decreasing the electromagnet current, $I_{MAG}$. If the ion beam etch profile is desirable, no change is made in the operating settings and the etching of the substrate is continued with the current operating parameters, which may be the original operating parameters or adjusted operating parameters.

In block 466, a decision is made whether to process another substrate. If not, then control is transferred to block 468 and the routine 450 stops. If an adjustment or correction to the operating settings was required for the substrate, then a query is generated in block 470 to determine if an adjustment should be made to the operating settings for the next substrate to be subjected to the routine 450. If not, then control is returned to block 452 and the operating settings for the next substrate revert to the initial operating settings. Alternatively, if adjustments are desired, control is transferred to block 472 and new initial operating settings are generated to improve the shape of the ion beam etch profile based upon the result of a correction of the current substrate. Control is returned to the entry point to block 454 and the iterative current adjustment and partial etch process is repeated for the new substrate.

Example 6

In one embodiment, the ion source 10 may be designed such that at the chosen operating parameters (other than the electromagnet settings) the ion beam etch profile only becomes more convex or more concave as the electromagnet current is increased from zero within the "usable" range of magnet current. The "usable" range of magnet current refers first to the adjustable range of the power supply and magnet design, but may also be limited by the etch performance requirements such as effects of the magnetic field on the beam divergence and/or beam neutralization, as described in respect to Tables 1 and 2.

In order to more fully be able to utilize the electromagnet to fine tune etch profile in such a case, which in general may require compensation of either a concave or convex beam profile, the radial transparency of the grid assembly 32 representing the ion optics may be designed that, in the absence of the electromagnetic field (i.e., the electromagnet current, $I_{MAG}$, supplied to the wire coils 72, 74 is set to zero), at the operating parameters (exclusive of the electromagnet current setting) of interest, the ion beam etch profile is made opposite in convexity to the effect of the magnet (more concave, if the effect of the magnetic field is to increase the convexity, and vice versa). The quantitative extent of this change in general may be optimized to allow the most desirable profile to be obtained for the estimated widest range of possible operating conditions and magnetic current settings. In the optimum case, the most desirable density profile will on average be achieved at some magnet current midway between zero and the maximum allowed setting.

For example, FIG. 11 graphically shows the effect of electromagnet current on the normalized shape profile, $K_N$, such that the ion beam etch profile become more convex as the electromagnet current, $I_{MAG}$, is increased in a low magnetic field range from 0 to 0.3 A.

Figure 13A:
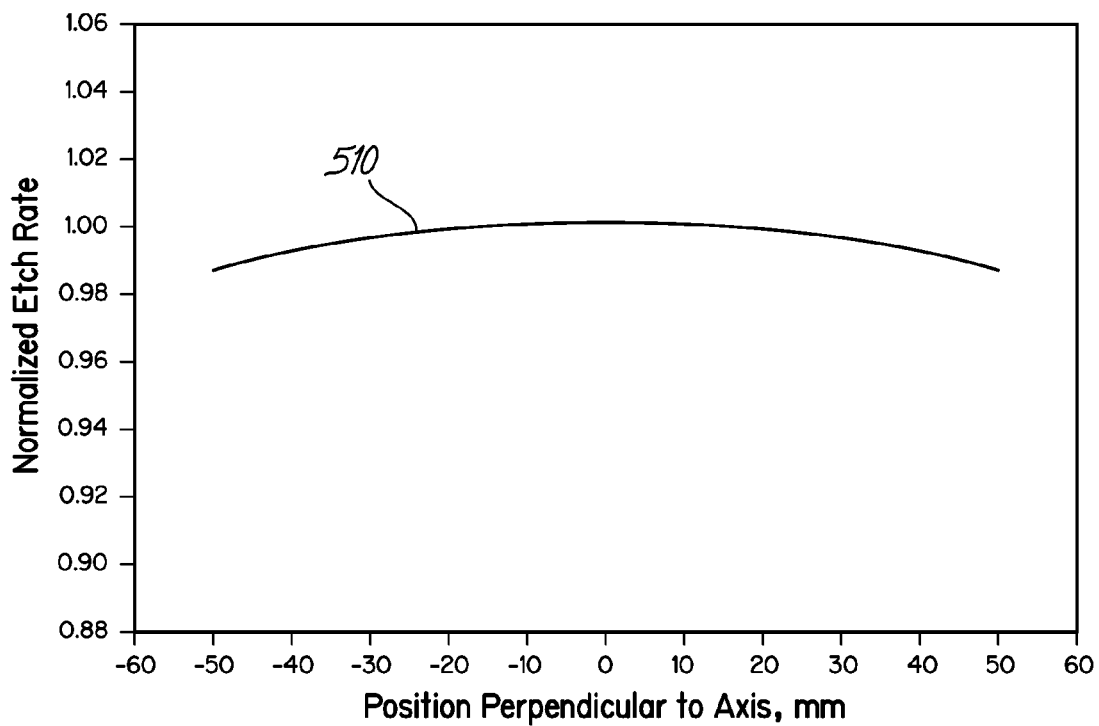
FIG. 13A is a diagrammatic view of normalized etch rate as a function of position relative to the azimuthal axis of the ion source for a substantially flat ion beam etch profile produced by an ion source of an embodiment of the invention at actual operating parameters and with the electromagnet current set to zero.
Figure 13B:
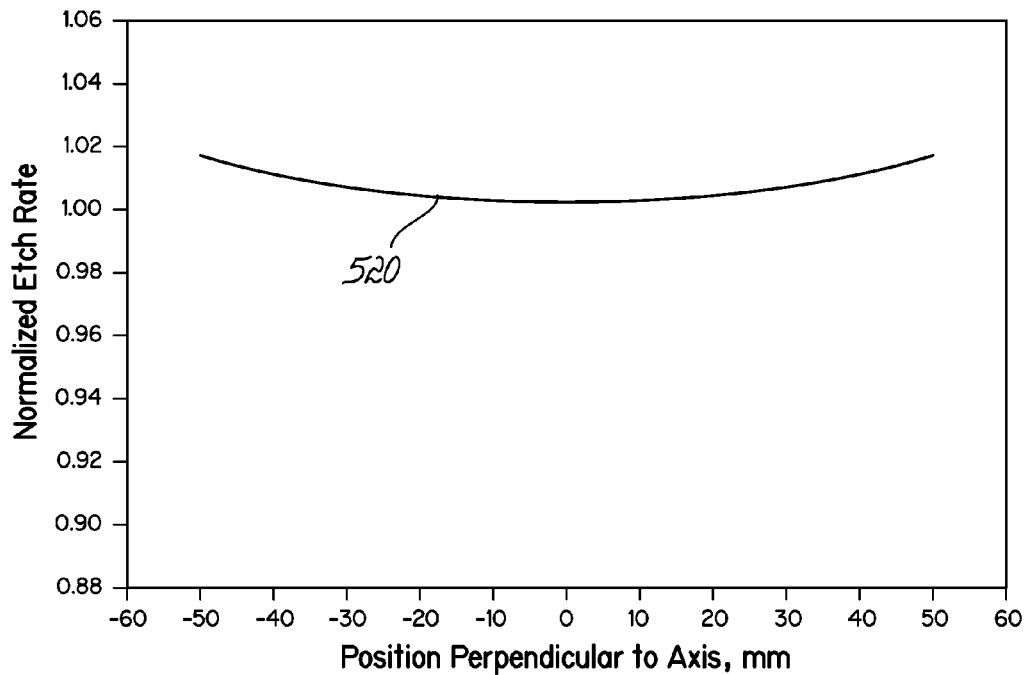
FIG. 13B is a diagrammatic view of a concave flat ion beam etch profile produced by one embodiment of the ion source of FIG. 13A at actual operating parameters with the electromagnet current set to zero when the ion optics grid radial transparency is adjusted.

FIG. 13A prophetically illustrates a slightly convex ion beam etch profile 510 for a given set of operating parameters produced by a previous embodiment of the ion source of FIGS. 1 and 2 with the electromagnet current, $I_{MAG}$, set equal to zero. This profile cannot be made more uniform by the electromagnet operated at low magnetic field strength due to the fact that small increases in the magnet current will only make the profile more concave. FIG. 13B prophetically illustrates an ion beam etch profile 520 produced by the same ion source at the same operating parameters with the electromagnet current, $I_{MAG}$, set to zero and the radial transparency of the grid assembly 32 in the design adjusted to reduce the convexity so that the resultant profile is more concave.

Figure 13C:
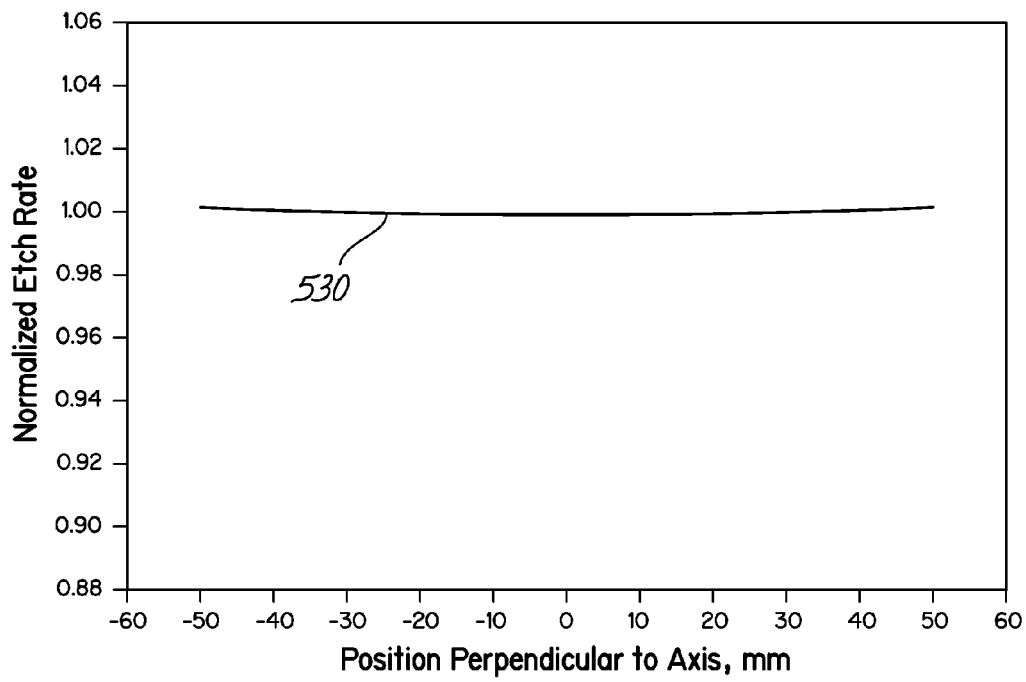
FIG. 13C is a diagrammatic view showing the substantially flat ion beam etch profile produced by one embodiment of the ion source of FIG. 13B at actual operating parameters with the electromagnet current set to a low value.

As prophetically illustrated in FIG. 13C, the electromagnet current, $I_{MAG}$, to the wire coils 72, 74 may in this case be increased slightly to a relatively low value to reduce the concavity of the ion beam etch profile 520 (FIG. 13B) and result in a more uniform ion beam etch profile 530. In the case of FIG. 11, this method may be beneficially employed to restrict the electromagnet operation to a low magnetic field range, which may be desirable to minimize the magnetic field interference with the ion optics operation (i.e., larger magnetic fields may increase the ion beam 15 divergence because of field plasma distortions in the vicinity of grid 38) and/or the ion beam 15 neutralization in downstream propagation to the substrate 11.

Figure 14A:
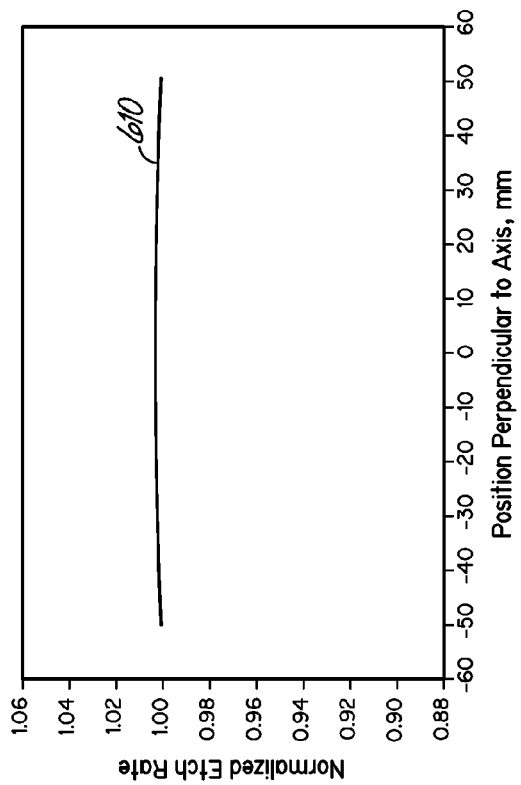
FIG. 14A is a diagrammatic view depicting degradation of the ion beam etch profile, as the ion source ages during use, from an initial condition as shown in FIG. 13B to a condition in which the profile is excessively convex about the azimuthal axis of the ion source.
Figure 14B:
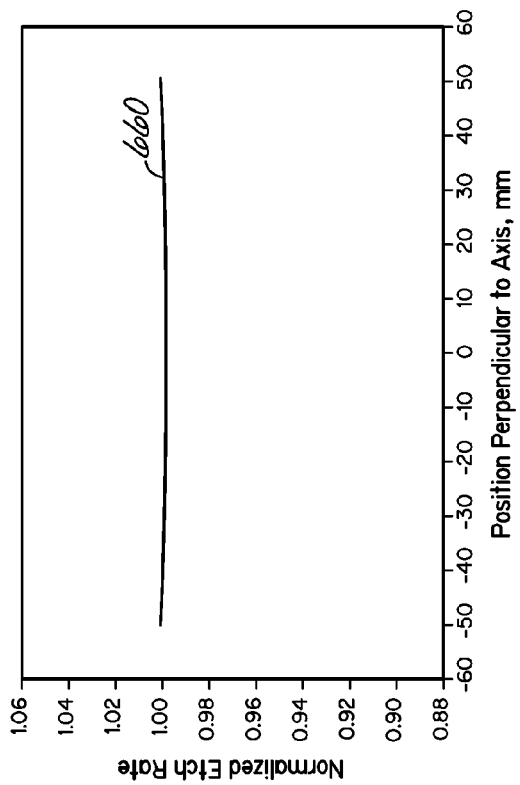
FIG. 14B is a diagrammatic view depicting an adjustment that may be made by decreasing the electromagnet current to restore the ion beam etch profile from the aged condition in FIG. 14A to an operating condition resembling the initial condition.

Adjustments to the electromagnet current, $I_{MAG}$, may similarly be utilized to control degradation of the ion beam etch profile as the ion source 10 ages. FIG. 14A prophetically illustrates degradation of the ion beam etch profile obtained in FIG. 13C (in the case where a uniform etch process is desired) that causes the flat profile 530 (FIG. 13C) to increase in convexity as the ion source 10 ages. Specifically, an ion beam etch profile 600 with an increased convexity may be observed as the ion source 10 ages with use. FIG. 14B prophetically illustrates the effect of the adjustment that may be made by decreasing the electromagnet current, $I_{MAG}$, supplied to the electromagnet to flatten the ion beam etch profile. Subsequently, a decrease in the electromagnet current, $I_{MAG}$, flattens the distribution of the ion flux to produce the ion beam etch profile 610 (FIG. 14B), which has less convexity than profile and more closely resembles profile 530 (FIG. 13C).

Figure 14C:
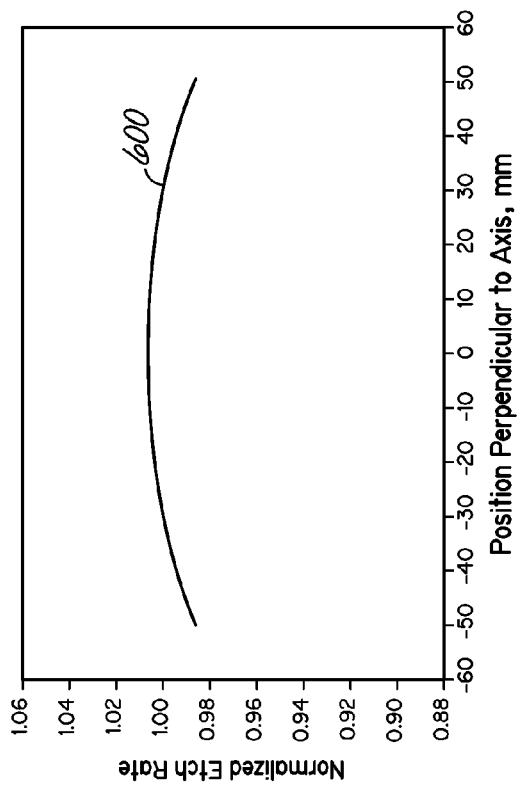
FIG. 14C is a diagrammatic view depicting degradation of the ion beam etch profile, as the ion source ages during use, from an initial condition as shown in FIG. 13B to a condition in which the profile is excessively concave about the azimuthal axis of the ion source.
Figure 14D:
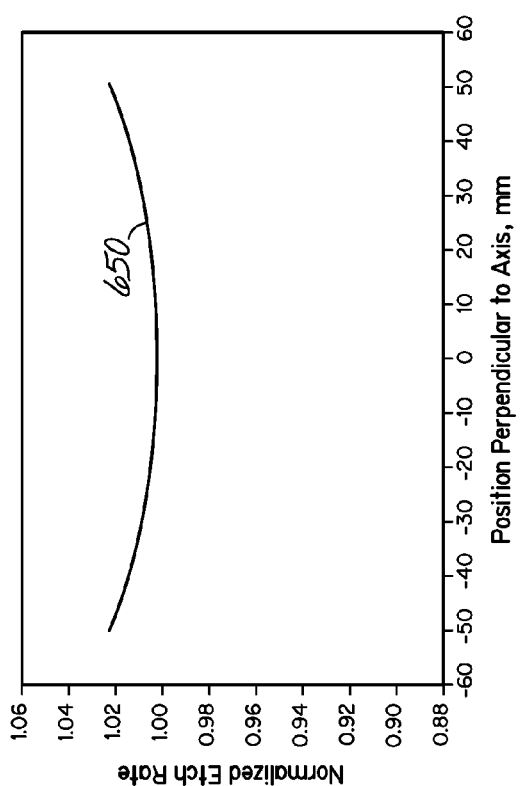
FIG. 14D is a diagrammatic view depicting an adjustment that may be made by decreasing the electromagnet current to restore the ion beam etch profile from the aged condition in FIG. 14C to an operating condition resembling the initial condition to a condition resembling the initial condition.

Vice versa, FIGS. 14C,D prophetically illustrate degradation of the flat profile in FIG. 13C that causes the shape profile 530 (FIG. 13C) to increase in concavity with aging of the ion source 10 and an adjustment that may be made by increasing the electromagnet current, $I_{MAG}$, to flatten the ion beam etch. Specifically, an ion beam etch profile 650 increases in concavity over time as the ion source 10 ages with operation. Subsequently, an increase in the electromagnet current, $I_{MAG}$, flattens the distribution of the ion flux to produce the ion beam etch profile 660 (FIG. 14D), which has less concavity and more closely resembles profile 530 (FIG. 13C).

If it is desired to optimize the magnetic field 75 differently for different substrates to be processed, the magnet current setting to the coils 72, 74 can be included as a variable in the process recipe. This value is communicated from the controller 87 to the electromagnet power supply 86. In order to adjust the magnet current to compensate for variations as described above, recipe control software can be used to automatically rewrite the process recipes.

Any non-uniformity in the ion beam etch profile from azimuthal asymmetry perpendicular to the ion source 10 about azimuthal axis 19 may be negligible or at least smaller than the radial non-uniformity. However, if the non-uniformity in the ion beam etch profile due to azimuthal asymmetry perpendicular to the azimuthal axis 19 of ion source 10 cannot be disregarded, other adjustments to the position of the electromagnet 42 may be made before using the above described methods.

While the invention has been illustrated by a description of the various embodiments and examples, and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of operating a radiofrequency ion source that includes a discharge chamber having a discharge space therein, an electromagnet disposed at a first end of the discharge space, and a first pole piece formed from a magnetically permeable material disposed proximate the electromagnet, the method comprising:
    generating a plasma with a plasma density distribution from a working gas in the discharge space of the discharge chamber;
    applying a current to the electromagnet to generate a magnetic field;
    magnetizing the first pole piece so as to change the plasma density distribution in the discharge space of the discharge chamber;
    extracting an ion beam from the plasma with at least one electrode disposed at a second end of the discharge space;
    determining an actual distribution profile of a density of the ion beam proximate to a wafer processing location;
    comparing the actual distribution profile of the ion beam density with a desired distribution profile for the ion beam density; and
    based upon the comparison, adjusting the current applied to the electromagnet to alter the magnetization of the first pole piece and further change the plasma density distribution in the discharge space of the discharge chamber.

2. The method of claim 1 wherein adjusting the current applied to the electromagnet further comprises:
    changing the plasma density distribution to reduce a difference between the actual distribution profile for the ion beam density and the desired distribution profile for the ion beam density.

3. The method of claim 1 wherein adjusting the current applied to the electromagnet further comprises:
    selecting the current to either increase or decrease a concavity or a convexity of the actual distribution profile about an azimuthal axis of the ion source.

4. The method of claim 1 wherein adjusting the current applied to the electromagnet further comprises:
    selecting the current to improve a uniformity of the actual distribution profile for the ion beam density.

5. The method of claim 1 wherein determining the actual density distribution profile for the ion beam density further comprises:
    inserting a plurality of Faraday probes into the ion beam to measure an ion current density at a plurality of positions; and
    generating the actual distribution profile for the ion beam density from the ion current density at each of the plurality of positions.

6. The method of claim 1 wherein adjusting the current applied to the electromagnet further comprises:
    communicating control signals indicative of the adjusted current from a controller to a power supply coupled with the electromagnet.

7. The method of claim 1 wherein comparing the actual distribution profile for the ion beam density with the desired distribution profile for the ion beam density further comprises:
    storing the actual distribution profile for the ion beam density and the desired distribution profile for the ion beam density in a memory of a controller; and
    executing an algorithm on the controller to compare the actual distribution profile for the ion beam density with the desired distribution profile for the ion beam density.

8. The method of claim 1 wherein magnetizing the pole piece of magnetically permeable material adjacent to the coil, and further comprises:
    shaping the magnetic field in the discharge space.

9. The method of claim 1 wherein adjusting the current applied to the electromagnet further comprises:
    automatically adjusting the current applied to the electromagnet without user intervention.

10. The method of claim 9 wherein determining the actual distribution of the ion beam density further comprises:
    measuring a wafer etch rate distribution or a beam profile inside a process chamber coupled with the discharge chamber.

11. The method of claim 1 wherein the actual density distribution profile exhibits a radial dependence about an azimuthal axis of the ion source, and comparing the desired density distribution for the ion beam density with the actual density distribution further comprises:
    creating a knowledge base relating the radial dependence of the actual distribution profile for the ion beam density to a magnitude of the current applied to the electromagnet.

12. The method of claim 11 wherein creating the knowledge base further comprises:
    sequentially supplying a plurality of different currents to the electromagnet;
    extracting the ion beam at each of the plurality of different currents;
    determining a reference distribution profile of the extracted ion beam density at each of the plurality of different currents; and
    collecting the reference distribution profile for the ion beam density at each of the plurality of different currents into a database that is correlated with a respective one of the plurality of different currents.

13. The method of claim 11 wherein the radial dependence is symmetrical about the azimuthal axis.

14. The method of claim 11 wherein adjusting the current applied to the electromagnet further comprises:
    choosing the magnitude of the current from the knowledge base that provides the desired distribution profile for the ion beam density.

15. The method of claim 1 wherein the at least one electrode is a portion of a grid assembly, and extracting the ion beam from the plasma further comprises:
applying one or more voltages to the grid assembly to extract the ion beam from the plasma.

16. The method of claim 15 wherein the actual distribution profile exhibits a radial dependence about an azimuthal axis of the ion source, and further comprising:
designing the grid assembly to have a variable radial transparency that influences a radial dependence of the extracted ion beam.

17. The method of claim 16 wherein the variable radial transparency of the grid assembly is designed to maximize an ability of the electromagnet to tune a shape of the actual distribution profile for the ion beam density to compensate for a difference in operating parameters or a difference in operating conditions.

18. The method of claim 16 wherein the variable radial transparency of the grid assembly is designed to allow an effect of the magnetic field to compensate for either concave-shaped deviations or convex-shaped deviations in the actual distribution profile for the ion beam density from the desired distribution profile for the ion beam density.

19. The method of claim 18 wherein the grid assembly is used with an ion source design and a usable range of the electromagnet current operation in which the effect of increasing the current only increases or decreases the concave-shaped deviations or the convex-shaped deviations of the actual distribution profile for the ion beam density.

20. A method of operating a radio frequency ion source that includes a discharge space and an electromagnet, the method comprising:
generating plasma with a plasma density distribution from a working gas in the discharge space;
sequentially applying a plurality of currents to the electromagnet to generate a magnetic field in the discharge space that is effective to form the plasma density distribution;
extracting an ion beam from the plasma at each of the plurality of different currents;
determining a reference distribution profile of the extracted ion beam density at east of the plurality of different currents;
determining an actual distribution profile of the ion beam density proximate to at least one wafer by etching the at least one wafer with the ion beam extracted from the discharge chamber at each of the plurality of different currents;
measuring an etch depth profile across each of the at least one wafer;
comparing the actual distribution profile of the ion beam density with a desired distribution profile for the ion beam density by relating the etch depth profile for each of the at least one wafer to the reference distribution profile of the ion beam density at the respective one of the plurality of different currents;
creating a knowledge base by relating a radial dependence about an azimuthal axis of the ion source for the actual distribution profile to the actual distribution profile for the ion beam density to a magnitude of each of the plurality of currents applied to the electromagnet; and
based upon the comparison, adjusting at least one of the supplied plurality of currents to the electromagnet to modify the magnetic field and, thereby, change the plasma density distribution.

21. A method of operating a radio frequency ion source that includes a discharge space and an electromagnet, the method comprising:
generating plasma with a plasma density distribution from a working gas in the discharge space;
extracting an ion beam from the plasma;
determining an actual distribution profile of a density of the ion beam proximate to wafer processing location by etching a wafer with the ion beam extracted from the discharge chamber;
measuring an etch rate profile across the wafer; and
comparing the actual distribution profile of the ion beam density with a desired distribution profile for the ion beam density by relating the etch rate profile to the actual distribution profile for the ion beam density; and
based upon the comparison, adjusting the current applied to the electromagnet to modify the magnetic field and, thereby, change the plasma density distribution.

22. A method of operating a radiofrequency ion source that includes a discharge space and an electromagnet, the method comprising:
generating plasma with a plasma density distribution from a working gas in the discharge space;
applying a current to the electromagnet to generate a magnetic field in the discharge space that is effective to form the plasma density distribution;
extracting an ion beam from the plasma;
determining an actual distribution profile of the ion beam density proximate to a wafer processing location by partially etching a wafer with the extracted ion beam;
measuring an etch rate profile across the partially etched wafer;
comparing the actual distribution profile of the ion beam density with a desired distribution profile for the ion beam density by relating the etch rate profile for the partially etched wafer to the actual distribution profile for the ion beam density; and
based upon the comparison, adjusting the current applied to the electromagnet to modify the magnetic field and, thereby, change the plasma density distribution.

23. The method of claim 22 wherein the etch rate profile is measured in-situ in a process chamber coupled with the discharge chamber.

24. The method of claim 22 further comprising:
moving the wafer from a process chamber coupled with the discharge chamber to a measurement module to measure an etch depth profile;
relating the etch depth profile to the actual distribution profile for the ion beam density; and
after the etch depth profile is measured, returning the wafer to the process chamber for further processing.

25. The method of claim 22 wherein adjusting the current applied to the electromagnet further comprises:
based upon the relating, causing the current applied to the electromagnet to incrementally change.

26. The method of claim 25 wherein relating and causing are repeated iteratively during treatment of a single wafer with the ion beam extracted from the plasma.

* * * * *

UNITED STATES PATENT AND TRADEMARK OFFICE
CERTIFICATE OF CORRECTION

| | | |
|---|---|---|
| PATENT NO. | : 8,158,016 B2 | Page 1 of 1 |
| APPLICATION NO. | : 12/037598 | |
| DATED | : April 17, 2012 | |
| INVENTOR(S) | : Alan V. Hayes et al. | |

It is certified that error appears in the above-identified patent and that said Letters Patent is hereby corrected as shown below:

In the Specification:

At column 3, line number 32, after "of," delete "a".

At column 4, line number 33, after "condition", delete "to a condition resembling the initial condition".

At column 5, line number 51, after "also", delete "may".

At column 8, line number 22, change "conductor" to --conductors--.

At column 11, line number 38, after "42", insert --of-- and at line number 44, change "supply" to --supplies--.

At column 13, line number 32, change "position" to --positions--.

At column 18, line number 49, after "between", delete "of".

At column 19, line number 60, change "needed" to --need--.

At column 22, line number 5, change "become" to --becomes--.

In the Claims:

At column 24, claim number 8, line number 27, after "coil,", delete "and".

At column 25, claim number 20, line number 42, change "east" to --each--.

Signed and Sealed this
Seventeenth Day of July, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,158,016 B2 | Page 1 of 1 |
| APPLICATION NO. | : 12/037598 | |
| DATED | : April 17, 2012 | |
| INVENTOR(S) | : Alan V. Hayes et al. | |

It is certified that error appears in the above-identified patent and that said Letters Patent is hereby corrected as shown below:

In the Specification:

At column 3, line number 32, after "of," delete "a the".

At column 4, line number 33, after "condition", delete "to a condition resembling the initial condition".

At column 5, line number 51, after "also", delete "may".

At column 8, line number 22, change "conductor" to --conductors--.

At column 11, line number 38, after "42", insert --of-- and at line number 44, change "supply" to --supplies--.

At column 13, line number 32, change "position" to --positions--.

At column 18, line number 49, after "between", delete "of".

At column 19, line number 60, change "needed" to --need--.

At column 22, line number 5, change "become" to --becomes--.

In the Claims:

At column 24, claim number 8, line number 28, before "further", delete "and".

At column 25, claim number 20, line number 42, change "east" to --each--.

This certificate supersedes the Certificate of Correction issued July 17, 2012.

Signed and Sealed this
Fourteenth Day of August, 2012

David J. Kappos
*Director of the United States Patent and Trademark Office*